United States Patent
Li et al.

(10) Patent No.: US 7,450,426 B2
(45) Date of Patent: *Nov. 11, 2008

(54) SYSTEMS UTILIZING VARIABLE PROGRAM VOLTAGE INCREMENT VALUES IN NON-VOLATILE MEMORY PROGRAM OPERATIONS

(75) Inventors: Yan Li, Milpitas, CA (US); Fanglin Zhang, San Jose, CA (US); Toru Miwa, Yokohama (JP); Farookh Moogat, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 93 days.

This patent is subject to a terminal disclaimer.

(21) Appl. No.: 11/548,267

(22) Filed: Oct. 10, 2006

(65) Prior Publication Data

US 2008/0084752 A1    Apr. 10, 2008

(51) Int. Cl.
    *G11C 11/34* (2006.01)
(52) U.S. Cl. .............................. 365/185.19; 365/185.17
(58) Field of Classification Search ............ 365/185.17, 365/185.19
    See application file for complete search history.

(56) References Cited

U.S. PATENT DOCUMENTS

| 5,220,531 A | 6/1993 | Blyth et al. |
| 5,313,421 A | 5/1994 | Guterman et al. |
| 5,386,422 A | 1/1995 | Endoh et al. |
| 5,412,601 A | 5/1995 | Sawada et al. |
| 5,521,865 A | 5/1996 | Ohuchi et al. |
| 5,570,315 A | 10/1996 | Tanaka et al. |
| 5,652,719 A | 7/1997 | Tanaka et al. |
| 5,712,180 A | 1/1998 | Guterman et al. |
| 5,712,815 A | 1/1998 | Bill et al. |
| 5,761,222 A | 6/1998 | Baldi |

(Continued)

FOREIGN PATENT DOCUMENTS

EP    0877386    11/1998

(Continued)

OTHER PUBLICATIONS

Response to Non-Final Office Action, U.S. Appl. No. 11/548,264, filed Oct. 10, 2006, Feb. 13, 2008.

(Continued)

*Primary Examiner*—Michael T Tran
(74) *Attorney, Agent, or Firm*—Vierra Magen Marcus & DeNiro LLP

(57) ABSTRACT

The lowest programmed state in multi-state non-volatile flash memory devices can suffer from an increased level of bit line to bit line capacitive charge coupling when compared with other states. Program voltages applied to memory cells as increasing voltage pulses can be incremented using smaller values when programming memory cells to the lowest programmable state. Smaller increments in the applied voltage allow for greater precision and a narrower threshold voltage distribution to compensate for the disproportionate charge coupling experienced by cells programmed to this state. Smaller increment values can be used when switching from lower page to upper page programming in some implementations. In a pipelined programming architecture where cells forming a physical page store two logical pages of data and programming for one logical page begins before receiving data for the other logical page, the increment value can be increased when switching from programming the first logical page to programming both pages concurrently.

40 Claims, 11 Drawing Sheets

U.S. PATENT DOCUMENTS

| | | | |
|---|---|---|---|
| 5,870,344 A | 2/1999 | Ozawa | |
| 5,926,409 A | 7/1999 | Engh et al. | |
| 5,949,714 A | 9/1999 | Hemink et al. | |
| 5,969,986 A | 10/1999 | Wong et al. | |
| 6,151,248 A | 11/2000 | Harari et al. | |
| 6,222,762 B1 | 4/2001 | Guterman et al. | |
| 6,243,290 B1 | 6/2001 | Kurata et al. | |
| 6,226,270 B1 | 7/2001 | Nobukata | |
| 6,278,632 B1 | 8/2001 | Chevallier | |
| 6,301,161 B1 | 10/2001 | Holzmann et al. | |
| 6,317,364 B1 | 11/2001 | Guterman et al. | |
| 6,343,033 B1 | 1/2002 | Parker et al. | |
| 6,373,748 B2 | 4/2002 | Ikehashi et al. | |
| 6,424,566 B1 | 7/2002 | Parker | |
| 6,490,201 B2 | 12/2002 | Sakamoto | |
| 6,496,410 B1 | 12/2002 | Parker | |
| 6,496,418 B2 | 12/2002 | Kawahara et al. | |
| 6,519,184 B2 | 2/2003 | Tanaka et al. | |
| 6,522,580 B2 | 2/2003 | Chen et al. | |
| 6,525,964 B2 | 2/2003 | Tanaka et al. | |
| 6,529,412 B1 | 3/2003 | Chen et al. | |
| 6,532,172 B2 | 3/2003 | Harari et al. | |
| 6,535,428 B2 | 3/2003 | Pasotti et al. | |
| 6,590,811 B1 | 7/2003 | Hamilton et al. | |
| 6,643,188 B2 | 11/2003 | Tanaka et al. | |
| 6,657,891 B1 | 12/2003 | Shibata et al. | |
| 6,714,457 B1 | 3/2004 | Hsu et al. | |
| 6,738,289 B2 | 5/2004 | Gongwear | |
| 6,807,095 B2 | 10/2004 | Chen et al. | |
| 6,809,962 B2 | 10/2004 | Uribe et al. | |
| 6,891,757 B2 | 5/2005 | Hosono et al. | |
| 6,937,520 B2 | 8/2005 | Ono et al. | |
| 6,958,934 B2 | 10/2005 | Fan et al. | |
| 6,990,019 B2 | 1/2006 | Tanaka et al. | |
| 7,120,051 B2 | 10/2006 | Gorobets et al. | |
| 7,173,859 B2 | 2/2007 | Hemink | |
| 7,239,550 B2* | 7/2007 | Pabustan et al. | 365/185.17 |
| 2002/0118574 A1 | 8/2002 | Gongwear et al. | |
| 2003/0034765 A1* | 2/2003 | Yang | 323/284 |
| 2005/0122779 A1 | 6/2005 | Fasoli et al. | |
| 2005/0122780 A1 | 6/2005 | Chen et al. | |
| 2006/0044872 A1 | 3/2006 | Nazarian | |
| 2006/0104120 A1 | 5/2006 | Hemink | |
| 2006/0125454 A1* | 6/2006 | Chen et al. | 323/282 |
| 2006/0221709 A1* | 10/2006 | Hemink et al. | 365/185.29 |
| 2006/0262602 A1 | 11/2006 | Nazarian | |
| 2007/0080376 A1* | 4/2007 | Adachi et al. | 257/239 |
| 2007/0091688 A1 | 4/2007 | Pabustan et al. | |
| 2007/0097749 A1 | 5/2007 | Li et al. | |
| 2007/0159907 A1 | 7/2007 | Kwak | |
| 2007/0242511 A1 | 10/2007 | Chen et al. | |

FOREIGN PATENT DOCUMENTS

| | | |
|---|---|---|
| EP | 1249842 | 10/2002 |
| EP | 1271553 A | 1/2003 |
| EP | 1426968 | 6/2004 |
| EP | 1615227 A | 1/2006 |
| WO | 9828745 | 7/1998 |
| WO | WO2005/041206 A | 5/2005 |
| WO | WO2006/107796 A2 | 10/2006 |

OTHER PUBLICATIONS

Kurata, et al., "Constant-Charge-Injection Programming for 10-MB/s Multilevel AG-AND Flash Memories," 2002 Symposium On VLSI Circuits Digest of Technical Papers, pp. 302-303.

Johnson, et al., "Session XII: ROMs, PROMs and EROMs," 1980 IEEE International Solid State Circuits Conference, pp. 152-153.

Nobukata, et al., "A 144Mb 8-Level NAND Flash Memory with Optimized Pulse Width Programming," 1999 Symposium on VLSI Circuits Digest of Technical Papers, pp. 39-40.

Ohikawa, et al., "TP 2.3: A 98 mm2.3.3V 64Mb Flash Memory with FN-NOR Type 4-level Cell," 1996 IEEE International Solid-State Circuits Conference, pp. 36-37.

U.S. Appl. No. 11/548,264, filed Oct. 10, 2006.

Non-Final Office Action, United States Patent & Trademark Office, U.S. Appl. No. 11/548,264, filed Oct. 10, 2006, Nov. 15, 2007.

Non-Final Office Action, United States Patent & Trademark Office, U.S. Appl. No. 11/548,264, filed Oct. 10, 2006, Mar. 20, 2008.

Response to Non-Final Office Action, United States Patent & Trademark Office, U.S. Appl. No. 11/548,264, filed Oct. 10, 2006, Jun. 20, 2008.

International Search Report & The Written Opinion of the International Searching Authority, Patent Cooperation Treaty, Application No. PCT/US2007/080617, Mar. 12, 2008.

* cited by examiner

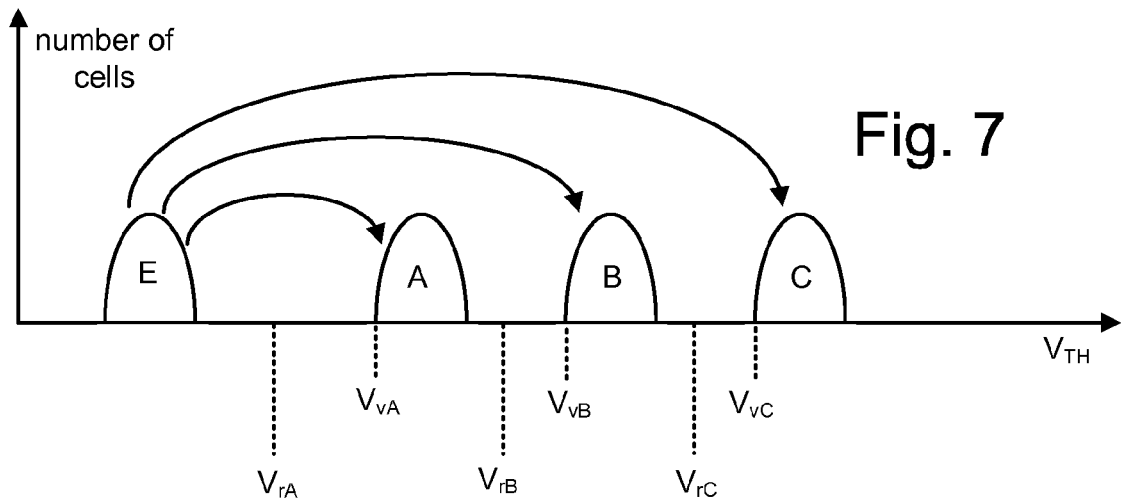

Fig. 7

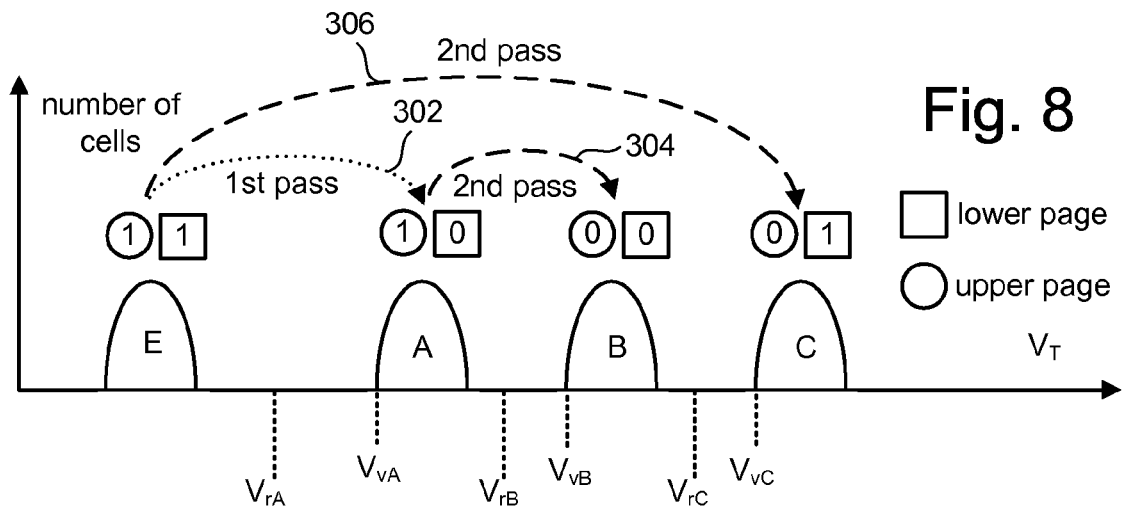

Fig. 8

| CELL | Programming Algorithm | Bitline to Bitline Coupling Effect on Cell | Exemplary Data |
|---|---|---|---|
| cell A with C neighbor | single page | $\alpha*\Delta V(C-E)$ | 6V |
| cell A with B neighbor | single page | $\alpha*\Delta V(B-A)$ | 2V |
| cell B with C neighbor | single page | $\alpha*\Delta V(C-B)$ | 2V |
| cell A with C neighbor | full sequence | $\alpha*\Delta V(C-A)$ | 4V |
| cell A with B neighbor | full sequence | $\alpha*\Delta V(B-A)$ | 2V |
| cell B with C neighbor | full sequence | $\alpha*\Delta V(C-B)$ | 2V |

SYSTEMS UTILIZING VARIABLE PROGRAM VOLTAGE INCREMENT VALUES IN NON-VOLATILE MEMORY PROGRAM OPERATIONS

CROSS-REFERENCE TO RELATED APPLICATION

The following application is cross-referenced and incorporated by reference herein in its entirety:

U.S. patent application Ser. No. 11/548,264, entitled "Variable Program Voltage Increment Values in Non-Volatile Memory Program Operations," by Li et al., filed on even date herewith.

BACKGROUND OF THE INVENTION

1. Field of the Invention

Embodiments in accordance with the present disclosure relate to programming non-volatile memory.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM), including flash EEPROM, and Electronically Programmable Read Only Memory (EPROM) are among the most popular non-volatile semiconductor memories.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by applying appropriate voltages to control gate 120CG via selection line SGD. Select gate 122 is controlled by applying the appropriate voltages to control gate 122CG via selection line SGS. Each of the transistors 100, 102, 104 and 106 includes a control gate and a floating gate, forming the gate elements of a memory cell. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

A typical architecture for a flash memory system using a NAND structure will include several NAND strings. For example, FIG. 3 shows three NAND strings 202, 204 and 206 of a memory array having many more NAND strings. Each of the NAND strings of FIG. 3 includes two select transistors or gates and four memory cells. For example, NAND string 202 includes select transistors 220 and 230, and memory cells 222, 224, 226 and 228. NAND string 204 includes select transistors 240 and 250, and memory cells 242, 244, 246 and 248. Each string is connected to the source line by one select gate (e.g. select gate 230 and select gate 250). A selection line SGS is used to control the source side select gates. The various NAND strings are connected to respective bit lines by select gates 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224 and memory cell 244. Word line WL1 is connected to the control gates for memory cell 226 and memory cell 246. Word line WL0 is connected to the control gates for memory cell 228 and memory cell 248. As can be seen, a bit line and respective NAND string comprise a column of the array of memory cells. The word lines (WL3, WL2, WL1 and WL0) comprise the rows of the array. Each word line connects the control gates of each memory cell in the row. For example, word line WL2 is connected to the control gates for memory cells 224, 244 and 252.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after a program operation is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored. A memory cell can also store multiple levels of information, for example, multiple bits of digital data. In the case of storing multiple levels of data, the range of possible threshold voltages is divided into the number of levels of data. For example, if four levels of information are stored, there will be four threshold voltage ranges assigned to the data values "11", "10", "01", and "00." In one example of a NAND type memory, the threshold voltage after an erase operation is negative and defined as "11." Three different positive threshold voltages are used for the states of "10", "01", and "00."

Relevant examples of NAND type flash memories and their operation are provided in the following U.S. patents/patent applications, all of which are incorporated herein by reference: U.S. Pat. Nos. 5,570,315; 5,774,397, 6,046,935, 6,456, 528 and U.S. patent application Ser. No. 09/893,277 (Publication No. US2003/0002348).

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. The floating gate charge and threshold voltage of the cell can be indicative of a particular state corresponding to stored data. More information about programming can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety.

Shifts in the apparent charge stored on a floating gate can occur because of coupling of an electric field based on the charge stored in adjacent floating gates. This floating gate to floating gate coupling phenomena is described in U.S. Pat. No. 5,867,429, which is incorporated herein by reference in its entirety. An adjacent floating gate to a target floating gate may include neighboring floating gates that are on the same bit line, neighboring floating gates on the same word line, or neighboring floating gates that are on both a neighboring bit line and neighboring word line, and thus, across from each other in a diagonal direction.

The floating gate to floating gate coupling phenomena occurs most pronouncedly, although not exclusively, between sets of adjacent memory cells that have been programmed at different times. For example, a first memory cell can be programmed to add a level of charge to its floating gate that corresponds to a set of data. Subsequently, one or more adjacent memory cells are programmed to add a level of charge to their floating gates that correspond to a set of data. After one or more of the adjacent memory cells are programmed, the charge level read from the first memory cell may appear to be different than when it was programmed because of the effect of the charge on the adjacent memory cell(s) being coupled to the first memory cell. The coupling from adjacent memory cells can shift the apparent charge level being read from a selected memory cell by a sufficient amount to lead to an erroneous reading of the data stored.

The effect of the floating gate to floating gate coupling is of greater concern for multi-state devices because in multi-state devices the allowed threshold voltage ranges and the forbidden ranges (range between two distinct threshold voltage ranges that represent distinct memory states) are narrower than in binary devices. Therefore, floating gate to floating gate coupling can result in memory cells being shifted from an allowed threshold voltage range to a forbidden range.

As memory cells continue to shrink in size, the natural programming and erase distributions of threshold voltages are expected to increase due to short channel effects, greater oxide thickness/coupling ratio variations and more channel dopant fluctuations, reducing the available separation between adjacent states. This effect is much more significant for multi-state memories than binary memories using only two states. Furthermore, the reduction of the space between word lines and between bit lines will also increase the coupling between adjacent floating gates.

SUMMARY OF THE INVENTION

The lowest programmed state in multi-state non-volatile flash memory devices can suffer from an increased level of bit line to bit line capacitive charge coupling when compared with other states. Program voltages applied to memory cells as increasing voltage pulses can be incremented using smaller values when programming memory cells to the lowest programmable level or state. Smaller increments in the applied voltage allow for greater precision and a narrower threshold voltage distribution to compensate for the disproportionate charge coupling experienced by cells programmed to this state. Smaller increment values can be used in one embodiment when programming a first logical page and larger increment values used when programming other pages. In a pipelined programming architecture where cells forming a physical page store two logical pages of data and programming for one logical page begins before receiving data for the other logical page, the increment value can be increased when switching from programming the first logical page to programming both pages concurrently.

In one embodiment, a method of programming non-volatile storage is provided that includes receiving a request to program data to a set of multi-state non-volatile storage elements, applying a predetermined number of program voltage pulses to the set of non-volatile storage elements to program the data to the non-volatile storage elements, and applying one or more additional program voltage pulses to the set of non-volatile storage elements to complete programming of the data. Applying a predetermined number of program voltage pulses to the set can include increasing a size of each of the program voltage pulses by a first increment value until the predetermined number is reached. Applying one or more additional program voltage pulses to the set can include increasing a size of each of the one or more additional program voltages by a second increment value.

In one embodiment, a method of programming non-volatile storage is provided. A first set of data designated for storage in a physical page of non-volatile storage is received. The first set of data can include less than all of a maximum amount of data storable by the physical page. In one embodiment, the first set of data forms a lower logical page of data. The first set of data is programmed to the physical page by programming the data using a program voltage signal having a peak value that is incremented by a first increment value when programming the data to the physical page. A second set of data is received that is also designated for storage in the physical page. The second set of data can be received after beginning programming of the first set of data to the physical page and prior to completing programming of the first set of data to the physical page. In response to receiving the second set of data prior to completing programming of the first set of data, programming of the first set of data is stopped or interrupted. After stopping programming of the first page of data, the first set of data and the second set of data are concurrently programmed to the physical page. Concurrently programming can include programming the first data and the second data using a program voltage signal having a peak value that is increased by a second increment value while concurrently programming the first data and the second data to the physical page.

In one embodiment, a non-volatile memory system is provided that includes a plurality of storage elements, a plurality of data buffers in communication with the storage elements and managing circuitry in communication with the buffers and storage elements. The managing circuitry receives first data to be stored in the storage elements and in response, provides the first data to a first set of the buffers. The managing circuitry programs the first data to the storage elements using a plurality of program voltage pulses increased by a first increment value. The managing circuitry receives second data to be stored in the storage elements while programming the first data and in response, provides the second data to a second set of the buffers. The managing circuitry stops programming the first data to the storage elements and begins concurrently programming the first data and the second data to the storage elements using a plurality of program voltage pulses increased by a second increment value.

Other features, aspects, and objects of embodiments of the disclosed technology can be obtained from a review of the specification, the figures, and the claims.

BRIEF DESCRIPTION OF THE DRAWINGS

FIG. 7 depicts an exemplary set of threshold voltage distributions and a full sequence programming process.

FIG. 8 depicts an exemplary set of threshold voltage distributions and a two-pass programming process.

FIG. 9 is a table depicting the effects of capacitive charge coupling in an exemplary non-volatile memory system.

DETAILED DESCRIPTION

Figure 4:
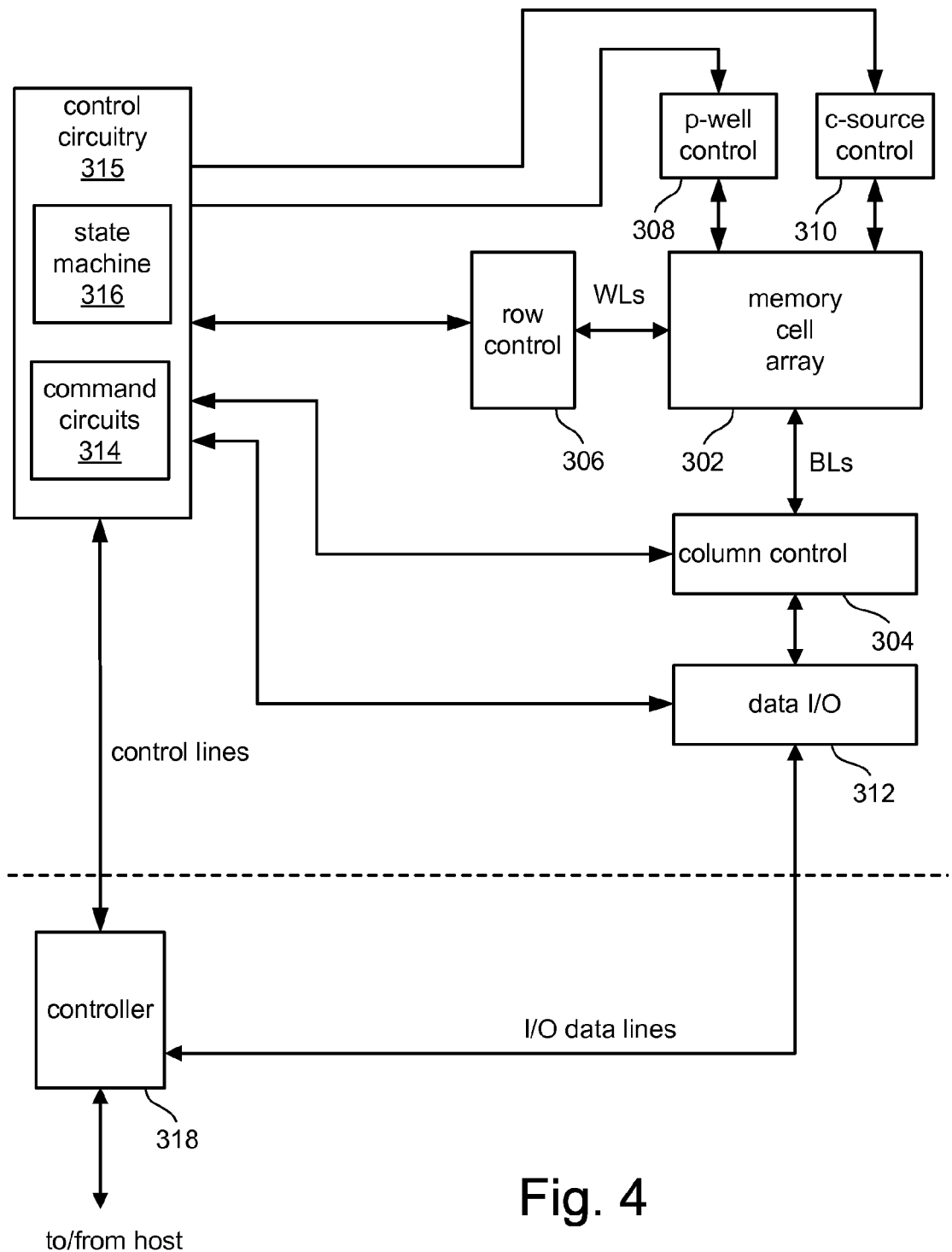
FIG. 4 is a block diagram of one embodiment of a non-volatile memory system.

FIG. 4 is a block diagram of one embodiment of a flash memory system that can be used to implement one or more embodiments of the present disclosure. Other systems and implementations can be used. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote or inhibit programming and erasing. Row control circuit 306 is connected to the word lines to select one of the word lines, to apply read voltages, to apply program voltages combined with the bit line potential levels controlled by column control circuit 304, and to apply an erase voltage. C-source control circuit 310 controls a common source line (labeled as "C-source" in FIG. 5) connected to the memory cells. P-well control circuit 308 controls the p-well voltage.

The data stored in the memory cells is read out by the column control circuit 304 and output to external I/O lines via data input/output buffer 312. Program data to be stored in the memory cells is input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316 which is part of control circuitry 315. State machine 316 controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected to or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314 which are part of control circuitry 315. Command circuits 314 are in communication with state machine 316. Controller 318 typically contains buffer memory for the user data being written to or read from the memory array.

One exemplary memory system comprises one integrated circuit that includes controller 318, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

Figure 5:
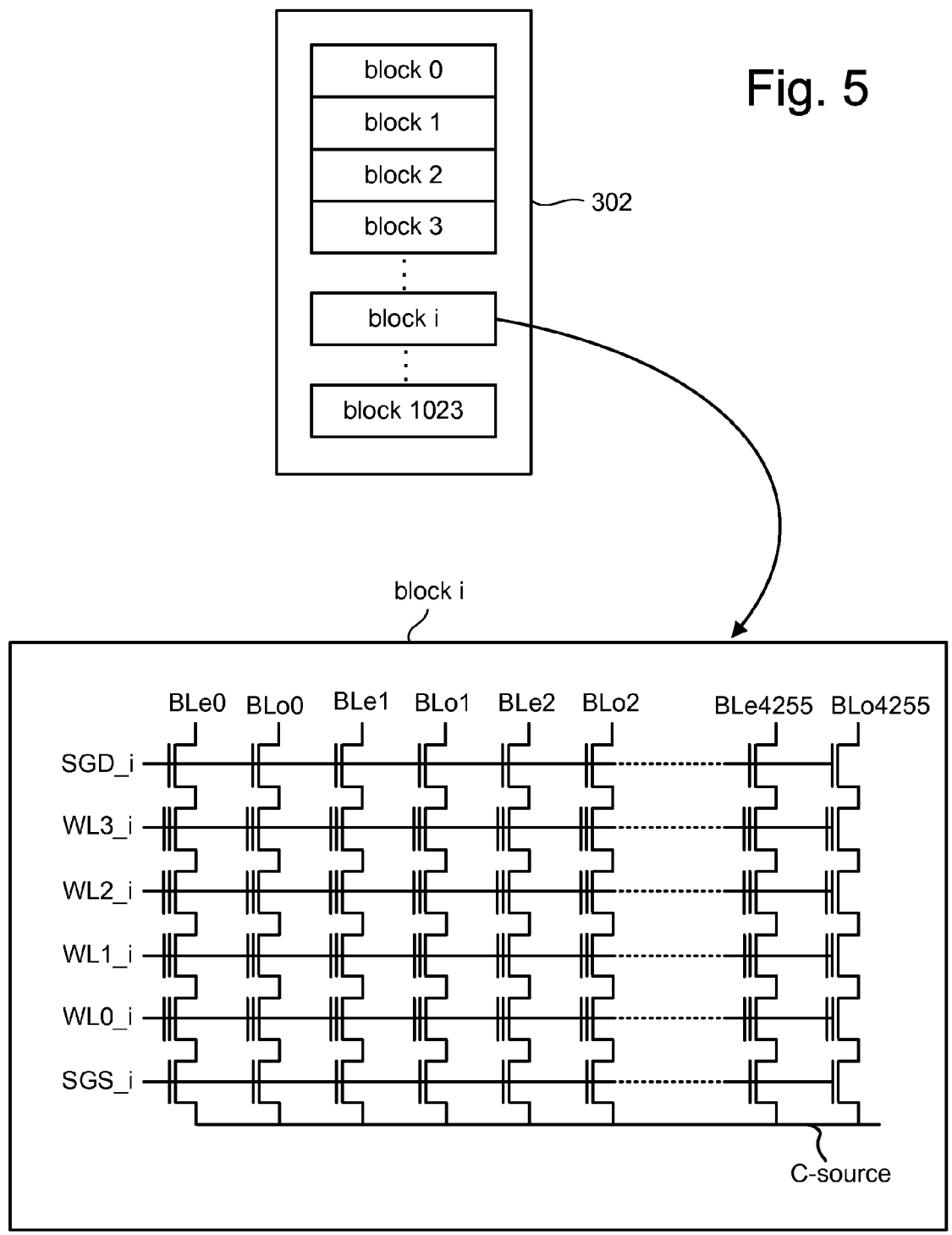
FIG. 5 illustrates an exemplary organization of a memory array.

With reference to FIG. 5, an exemplary structure of memory cell array 302 is described. As one example, a NAND flash EEPROM is described that is partitioned into 1,024 blocks. The data stored in each block can be simultaneously erased. In one embodiment, the block is the minimum unit of cells that are simultaneously erased. In each block in this example, there are 8,512 columns. Each block is typically divided into a number of pages which can be a unit of programming. Other units of data for programming are also possible and contemplated. In one embodiment, individual pages may be divided into segments and the segments may contain the fewest number of cells that are written at one time as a basic programming operation. One or more pages of data are typically stored in one row of memory cells.

In each block of the example in FIG. 5 there are 8,512 columns that are divided into even columns and odd columns. The bit lines are divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. FIG. 5 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor or gate (connected to select gate drain line SGD), and another terminal is connected to c-source via a second select transistor (connected to select gate source line SGS).

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time.

During read and programming operations of one embodiment, 4,256 memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. Other sized blocks and pages can also be used with embodiments. Additionally, architectures other than that of FIGS. 4 and 5 can also be used to implement embodiments.

Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative (in one embodiment).

In the read and verify operations, the select gates of a selected block are raised to one or more select voltages and the unselected word lines (e.g., WL0, WL1 and WL3) of the selected block are raised to a read pass voltage (e.g. 4.5 volts) to make the transistors operate as pass gates. The selected word line of the selected block (e.g., WL2) is connected to a reference voltage, a level of which is specified for each read and verify operation in order to determine whether a threshold voltage of the concerned memory cell is above or below such level. For example, in a read operation of a one bit memory cell, the selected word line WL2 is grounded, so that it is detected whether the threshold voltage is higher than 0V. In a verify operation of a one bit memory cell, the selected word line WL2 is connected to 0.8V, for example, so that as programming progresses it is verified whether or not the threshold voltage has reached 0.8V. The source and p-well are at zero volts during read and verify. The selected bit lines (BLe) are pre-charged to a level of, for example, 0.7V. If the threshold voltage is higher than the read or verify level, the potential level of the concerned bit line (BLe) maintains the high level, because of the associated non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is detected by a sense amplifier that is connected to the bit line and senses the resulting bit line voltage. The difference between whether the memory cell is programmed or erased depends on whether or not net negative charge is stored in the floating gate. For example, if negative charge is stored in the floating gate, the threshold voltage becomes higher and the transistor can be in enhancement mode of operation.

When programming a memory cell in one example, the drain and the p-well receive 0V while the control gate receives a series of programming pulses with increasing magnitudes. In one embodiment, the magnitudes of the pulses in the series range from 12V to 24V. In other embodiments, the range of pulses in the series can be different, for example, having a starting level of higher than 12 volts. During programming of memory cells, verify operations are carried out in the periods between the programming pulses. That is, the programming level of each cell of a group of cells being programmed in parallel is read between each programming pulse to determine whether or not it has reached or exceeded a verify level to which it is being programmed. One means of verifying the programming is to test conduction at a specific compare point. The cells that are verified to be sufficiently programmed are locked out, for example in NAND cells, by raising the bit line voltage from 0 to $V_{DD}$ (e.g., 2.5 volts) for all subsequent programming pulses to terminate the programming process for those cells. In some cases, the number of pulses will be limited (e.g. 20 pulses) and if a given memory cell is not sufficiently programmed by the last pulse, an error is assumed. In some implementations, memory cells are erased (in blocks or other units) prior to programming.

Figure 1:
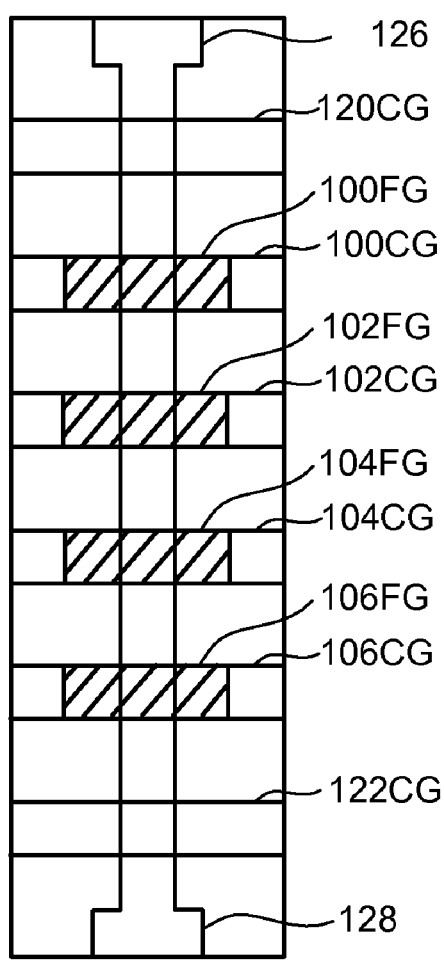
FIG. 1 is a top view of a NAND string.
Figure 2:
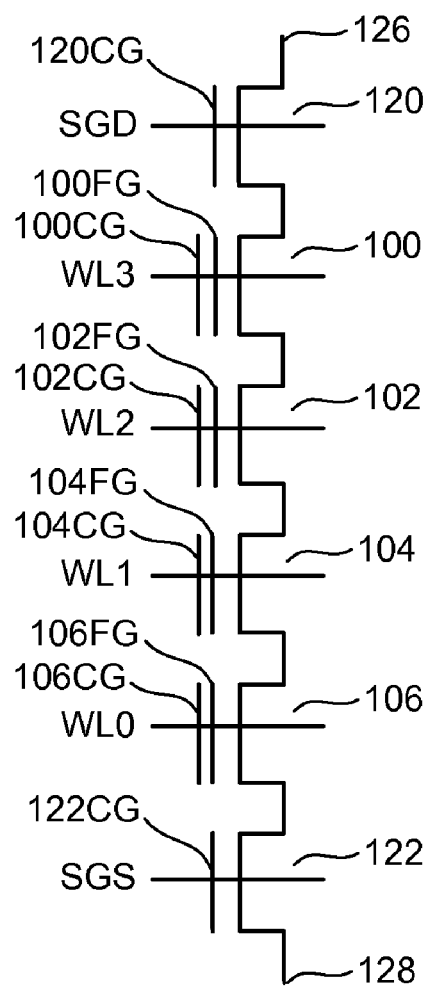
FIG. 2 is an equivalent circuit diagram of the NAND string of FIG. 1.
Figure 3:
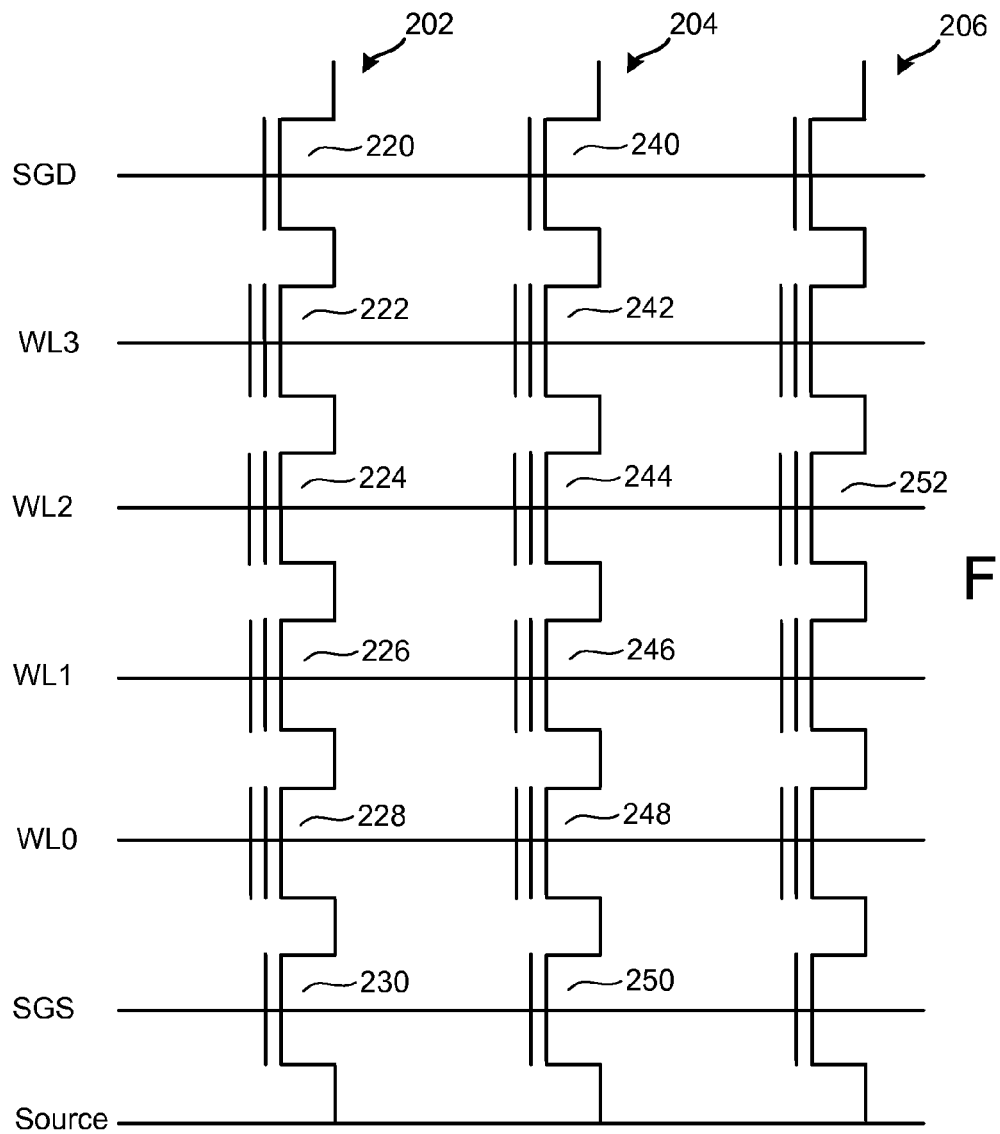
FIG. 3 is a circuit diagram depicting three NAND strings.
Figure 6:
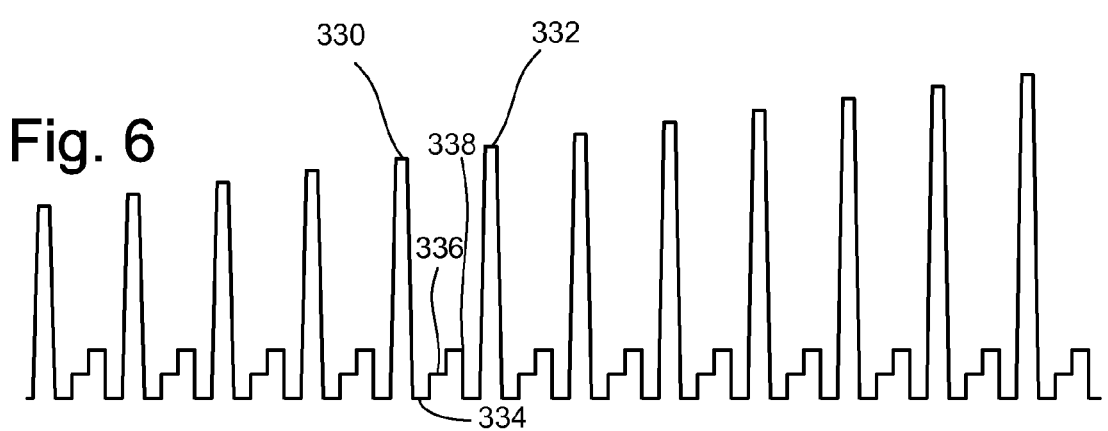
FIG. 6 depicts an exemplary program voltage signal.

FIG. 6 depicts a program voltage signal in accordance with one embodiment. This signal has a set of pulses with increasing magnitudes. The magnitude of the pulses is increased with each pulse by a predetermined step size. In one embodiment that includes the memory cells storing multiple bits of data, an exemplary step size is 0.2V (or 0.4V). Between each of the program pulses are the verify pulses. The signal of FIG. 6 assumes a four state memory cell, therefore, it includes three verify pulses. For example, between programming pulses 330 and 332 are three sequential verify pulses. The first verify pulse 334 is depicted at a zero volt verify voltage level. The second verify pulse 336 follows the first verify pulse at the second verify voltage level. The third verify pulse 338 follows the second verify pulse 336 at the third verify voltage level. A multi-state memory cell capable of storing data in eight states may need to perform verify operations at seven compare points. Thus, seven verify pulses are applied in sequence to perform seven verify operations at seven verify levels between two consecutive programming pulses. Based on the seven verify operations, the system can determine the state of the memory cells. One means for reducing the time burden of verifying is to use a more efficient verify process, for example, as disclosed in: U.S. patent application Ser. No. 10/314,055, entitled "Smart Verify for Multi-State Memories," filed Dec. 5, 2002; U.S. patent application Ser. No. 11/259,799, entitled "Apparatus for Programming of Multi-State Non-Volatile Memory Using Smart Verify," filed Oct. 27, 2005; and U.S. patent application Ser. No. 11/260,658, entitled "Method for Programming of Multi-State Non-Volatile Memory Using Smart Verify," filed Oct. 27, 2005, all of which are incorporated herein by reference in their entirety.

The erase, read and verify operations described above are performed according to techniques known in the art. Thus, many of the details explained can be varied by one skilled in the art.

At the end of a successful program process, the threshold voltages of the memory cells should be within one or more distributions of threshold voltages for programmed memory cells or within a distribution of threshold voltages for erased memory cells, as appropriate. FIG. 7 illustrates threshold voltage distributions for the memory cell array when each memory cell stores two bits of data. FIG. 7 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 7 corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a gray code assignment so that if the threshold voltage of a floating gate erroneously shifts to its neighboring physical state, only one bit will be affected. However, in other embodiments, gray coding is not used. One example assigns "11" to threshold voltage range E (state E), "10" to threshold voltage range A (state A), "00" to threshold voltage range B (state B) and "01" to threshold voltage range C (state C). Although FIG. 7 shows four states, the present invention can also be used with other multi-state structures including those that include more or less than four states.

FIG. 7 also shows three read reference voltages, $V_{rA}$, $V_{rB}$ and $V_{rC}$, for reading data from memory cells. By testing whether the threshold voltage of a given memory cell is above or below $V_{rA}$, $V_{rB}$ and $V_{rC}$, the system can determine what state the memory cell is in. FIG. 7 also shows three verify reference voltages, $V_{vA}$, $V_{vB}$ and $V_{vC}$. When programming memory cells to state A, the system will test whether those memory cells have a threshold voltage greater than or equal to $V_{vA}$. When programming memory cells to state B, the system will test whether the memory cells have threshold voltages greater than or equal to $V_{vB}$. When programming memory cells to state C, the system will determine whether memory cells have their threshold voltage greater than or equal to $V_{vC}$.

FIG. 7 depicts one embodiment that utilizes full sequence programming. In full sequence programming, memory cells can be programmed from the erase state E directly to any of the programmed states A, B or C. For example, a population of memory cells to be programmed may first be erased so that all memory cells in the population are in erased state E. The process hereinafter described with respect to FIG. 7, using a series of program voltage pulses applied to the control gates of selected memory cells, will then be used to program the memory cells directly into states A, B or C. While some memory cells are being programmed from state E to state A, other memory cells are being programmed from state E to state B and/or from state E to state C.

FIG. 8 illustrates an example of a two-pass technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 302. That concludes the first programming pass.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 306. If the cell had been programmed into state A as a result of the first programming pass, then the memory cell is further programmed in the second pass so that the threshold voltage is increased to be within state B, as depicted by arrow 304. The result of the second pass is to program the cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page with the data received. When subsequent data is received, the system will then program the upper page. In yet another embodiment, the system can start writing data using the two-pass technique and then convert to full sequence programming mode if enough data is subsequently received to fill up an entire (or most of a) word line's memory cells. More details of such an embodiment are disclosed in U.S. patent application titled "Pipelined Programming of Non-Volatile Memories Using Early Data," Ser. No. 11/013,125, filed on Dec. 14, 2004, inventors Sergy Anatolievich Gorobets and Yan Li, incorporated herein by reference in its entirety.

Other programming techniques can be used in accordance with various embodiments in addition to full sequence and upper page—lower page programming as shown in FIG. 8. For example, in one embodiment a two-pass technique that reduces floating gate to floating gate coupling between cells on different word lines by, for any particular memory cell, writing to that particular memory cell with respect to a particular page subsequent to writing to adjacent memory cells for previous pages, can be used. In one example of this technique, the memory cells store two bits of data per memory cell, using four data states (e.g., non-Gray coding where erased state E stores 11, programmed states A, B and C store 01, 10, and 00, respectively). Each memory cell stores two pages of data that, for reference purposes, will be called upper page and lower page. In a first pass, the lower page is programmed—a memory cell that is to store data 1 in the lower page remains at state E, while a memory cell that is to store data 0 is raised to an intermediate state B'. In a second pass, the upper page is programmed. A memory cell in erased state E that is to store data 1 for the upper page remains at state E, while a memory cell in state E that is to store data 0 for the upper page is programmed to state A. A memory cell in the intermediate state B' that is to store data 1 for the upper page is programmed to final state B, while a memory cell in the intermediate state B' that is to store data 0 for the upper page is programmed to state C.

FIG. 9 is a table depicting the various capacitive charge coupling effects for cells programmed in both a single page technique such as upper/lower page programming and full sequence programming where all data states are programmed at once. The table of FIG. 9 depicts the effects for a four state memory device but it will be appreciated by those of ordinary skill in the art that the embodied principles can be used with systems having more physical states. In both single page programming and full sequence programming, the memory cells programmed to the first programmed state A, suffer the most effects from capacitive charge coupling. The first row depicts single page programming (column 382) and a memory cell in state A with a neighbor programmed to state C (column 384). The cell in state A will experience an increase in its apparent threshold voltage that is equal to the product of a constant α, representing the coupling coefficient between floating gates, and the change in voltage between the erased state E and the programmed state C. Because the memory cell in state A was programmed when programming a first page and its neighbor was programmed to state C later when programming a second page, the neighbor's floating gate voltage will rise by the difference between the erased state and the C programmed state. Column 386 sets forth exemplary threshold voltage changes for a memory cell programmed between the various states in a memory system. In the provided example, programming from state E to state C will shift the threshold voltage about 6V. The memory cell in state A will experience an apparent shift in its threshold voltage equal to the product of this difference and the coupling coefficient. A cell in state A with a neighbor programmed to state B will experience an apparent shift equal to the product of the constant and the change in voltage between the first programmed state A and the second programmed state B (e.g., 2V). A cell in state B with a neighbor in state C will experience an apparent shift in threshold voltage equal to the product of the constant and the change in voltage between the second programmed state B and the third programmed state C (e.g., 2V).

Although state A memory cells experience less capacitive charge coupling in full sequence programming, they still experience the most when compared to the cells in other states. For a memory cell in state A with a neighbor programmed to state C in full sequence the programming, the neighbor will only rise from state A to state C (e.g., 2V) after the selected memory cell is programmed. In full sequence, all states are programmed at the same time. Thus, the selected cell will reach state A around the same time as its neighbor in most cases. Thus, the only coupling effects after the selected cell was programmed are reflected by the neighbor moving from state A to state C.

A cell in state A with a neighbor programmed to state B will experience an apparent shift equal to the product of the constant and the change in voltage between the first programmed state A and the second programmed state B (e.g., 2V). A cell in state B with a neighbor in state C will experience an apparent shift in threshold voltage equal to the product of the constant and the change in voltage between the second programmed state B and the third programmed state C (e.g., 2V).

As FIG. 9 illustrates, cells in the lowest programmed physical state will suffer the most capacitive charge coupling from later programmed neighbors. These disproportionate coupling effects can widen the A state distribution and possibly cause read errors. In order to compensate for the greater amount of apparent threshold voltage shift experienced by cells in the first programmed state, the first programmed state is programmed with greater precision to compensate for the additional charge coupling effects in one embodiment. In various embodiments, techniques are used to achieve a tighter threshold voltage distribution for the first programmed state to compensate for a subsequent change in its apparent threshold voltage. A lower increment value for the program voltage signal can be used when programming cells to the lowest programmable state in one embodiment. In another embodiment, the increment value is lower when programming a first logical page of data to a set of memory cells and larger when programming a second logical page of data to the set. In a pipelined architecture, the increment value can be increased when the memory switches from single page programming to full sequence programming.

Figure 10:
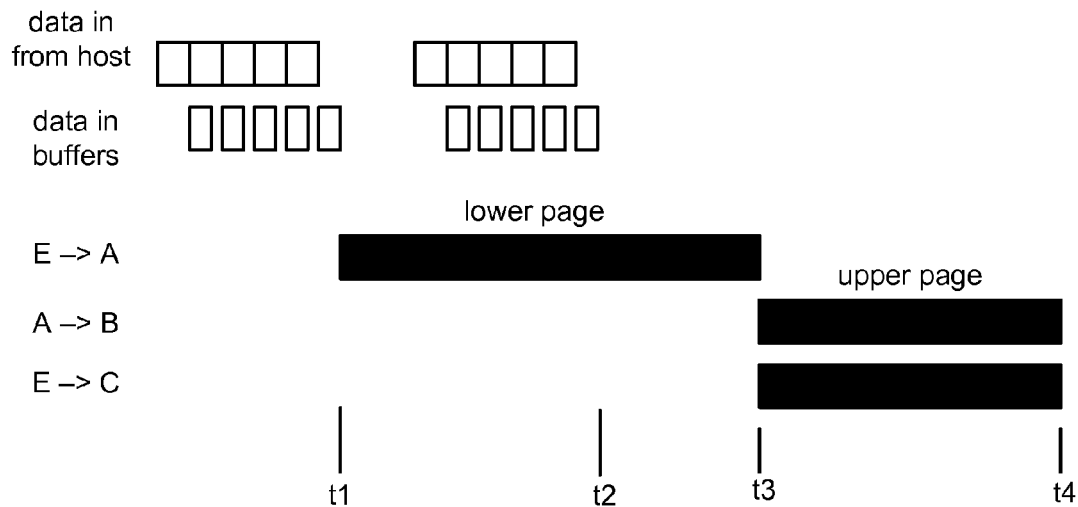
FIG. 10 is a timing diagram for programming lower page data and upper page data during discrete intervals of time.

FIG. 10 is a timing diagram illustrating a non-volatile memory system processing and writing individual logical pages of data, where a first page of data for a set of cells is completed before beginning a second page of data. Data from the host device is first received at the controller. The controller forwards the data and address information to the column control circuitry which places the data in the data registers. In FIG. 10, a lower page of data is received by the controller before an upper page of data for the same memory cells. The appropriate registers are loaded and in response to a program command from the controller, the state machine will begin programming the lower page data into the set of cells at time t1.

Data for the upper page of data for the corresponding set of memory cells is received from the host after time t1. The controller completes loading of the data into the registers at the array at time t2. In the particular embodiment of FIG. 10, the system does not program the upper page of data until the lower page has been programmed. Accordingly, the state machine continues to program the lower page of data into the set of cells until time t3, and the upper page data remains in the registers. Once the lower page data is programmed, the controller can issue a program command for the upper page of data and the state machine respond by programming the upper page data from the registers into the array. As depicted, programming the upper page includes programming cells from state E to state C and from state A to state B. In an alternate embodiment, a two-pass technique as previously described is used such that upper page programming includes programming cells from state E to state, and from an intermediate state to state B and state C.

Figure 11:
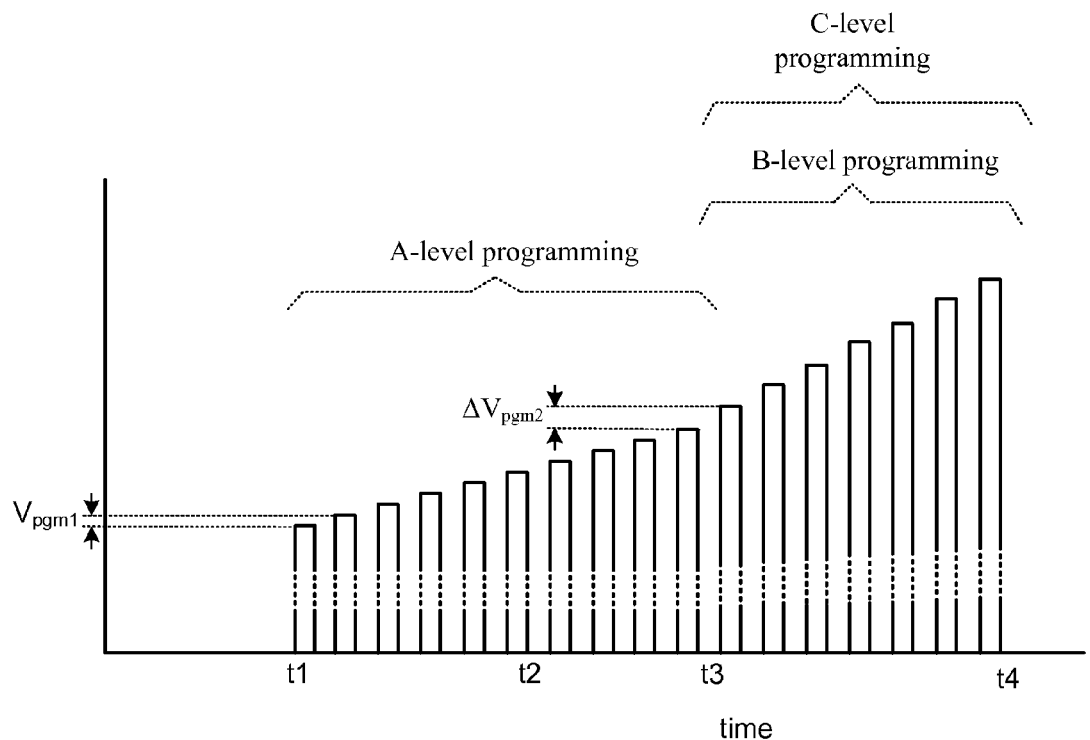
FIG. 11 is a program voltage signal in accordance with one embodiment that can be used to program the lower and upper pages of data as shown in FIG. 10.

In accordance with one embodiment of the technology disclosed herein, a different increment value for the program voltage signal is used in an embodiment as shown in FIG. 10 when programming the upper page at time t3. FIG. 11 depicts a program voltage signal in accordance with one embodiment. Programming memory cells from the erased state to state A begins at time t1 when a first program voltage pulse is applied. After performing a verification to determine which cells, if any, are programmed to state A, an additional pulse is applied with a peak value incremented by $\Delta Vpgm1$. This continues until lower page programming completes at time t3.

Lower page programming can complete after the number of program voltage pulses reaches a predetermined maximum number or after a sufficient number of memory cells to be programmed to state A are successfully verified as having reached state A. With the memory cells for state A programmed, or with lower page programming having completed, the program voltage increment value is changed to $\Delta Vpgm2$. $\Delta Vpgm2$ is larger than $\Delta Vpgm1$ in order to speed up the programming process in one embodiment. In one embodiment, $\Delta Vpgm2$ is selected after analysis to determine an appropriate value for programming the majority of memory cells in an array as quickly as possible (larger increment value), but while also ensuring precise programming of data (smaller increment value). The value of $\Delta Vpgm1$ can be an adjusted value of $\Delta Vpgm2$ to compensate for the increased amount of charge coupling experienced by the cells programmed to state A. For example, $\Delta Vpgm1$ can be lowered from the $\Delta Vpgm2$ value based on the amount of additional capacitive charge coupling it receives. Referring to FIG. 9 for example, $\Delta Vpgm1$ when programming state A could be lower than $\Delta Vpgm2$ by an amount based on the 4V difference in the floating gate voltage of its neighbor after programming versus the 2V difference for the cells programmed to states B and C. By way of non-limiting example, $\Delta Vpgm1$ for the lower page could be about 0.3V in one embodiment and $\Delta Vpgm2$ about 0.4V for upper page or full sequence programming.

Figure 12:
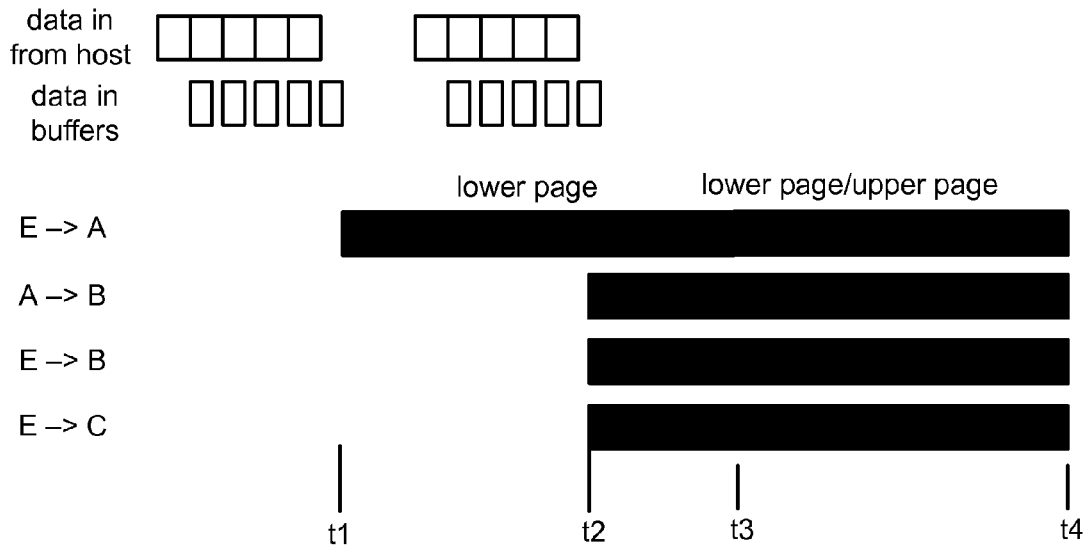
FIG. 12 is a timing diagram for programming lower page data and then concurrently programming lower and upper page data when upper page data is received.

FIG. 12 is a timing diagram illustrating a non-volatile memory system processing and writing logical pages of data, where programming begins for a first page of data and then pauses or interrupts when a second page of data is received in order to begin full sequence programming for all the pages. Data from the host device is received at the controller. The controller forwards the data and address information to the column control circuitry which places the data in the data registers. In FIG. 12, a lower page of data is received by the controller before an upper page of data for the same memory cells. The appropriate registers are loaded and in response to a program command from the controller, the state machine begins programming the lower page data into the set of cells at time t1.

Upper page data for the same set of memory cells is received from the host after time t1. The controller completes loading of the data into the registers at the array at time t2. After determining that the new data is upper page data for the same cells, the controller can interrupt the program operation. In the particular embodiment of FIG. 12, the system can interrupt, pause, or otherwise stop the lower page programming process to switch to a full sequence operation. In one embodiment, the controller only stops the lower page programming operation if it is not complete already or not sufficiently complete to warrant allowing it to finish.

The controller can issue a new program command for full sequence programming after providing the upper page data to the data registers in the column control circuitry. A verification operation can be performed to lock out those cells that have reached their target states. Programming then continues for both pages of data using full sequence programming.

Figure 13:
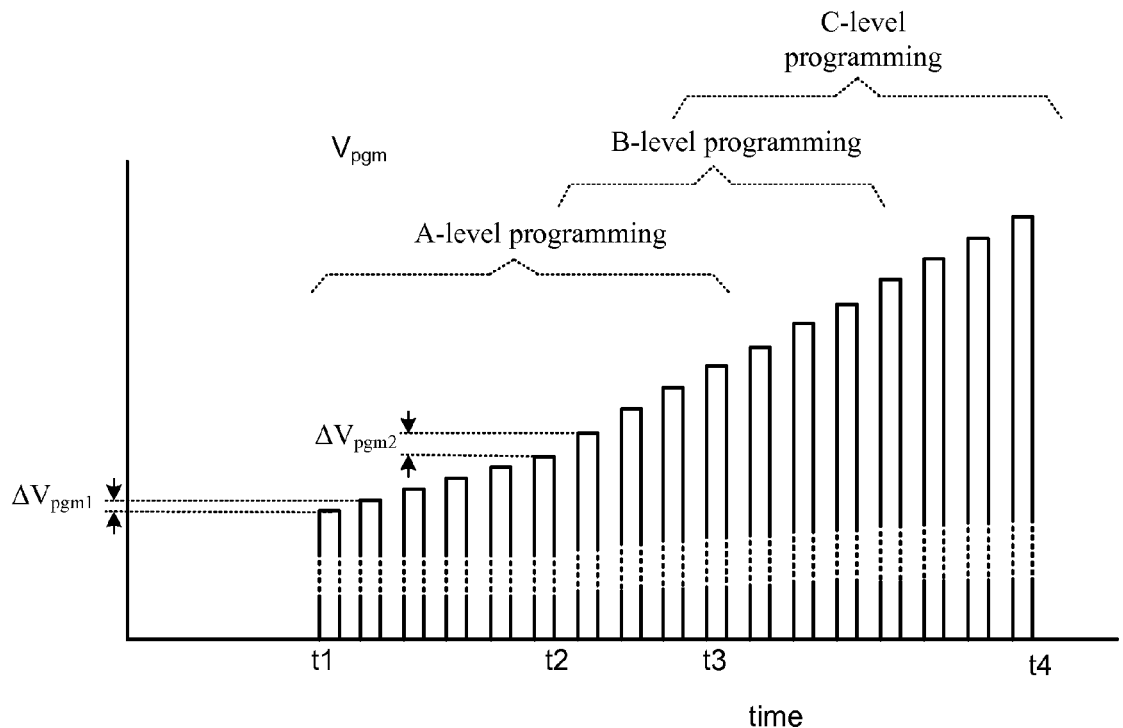
FIG. 13 is a program voltage signal in accordance with one embodiment that can be used to program the lower and upper pages of data as shown in FIG. 12.

In accordance with one embodiment, a different increment value for the program voltage signal is used in an embodiment as shown in FIG. 12 when utilizing full sequence programming after time t2. FIG. 13 depicts a program voltage signal in accordance with one embodiment. Programming memory cells from the erased state to state A begins at time t1 when a first erase voltage pulse is applied. Before programming to state A for the lower page is complete, upper page data is received from the host. The controller issues the data to the column control circuitry where it is stored in registers at time t2.

After verifying, locking out, and issuing a new program command, full sequence programming begins with the first pulse after time t2. With the full sequence command issued, the next program voltage pulse is incremented by ΔVpgm2 over the last program voltage pulse before stopping lower page programming. ΔVpgm2 and ΔVpgm1 values can vary by embodiment and the requirements of various implementations. In one embodiment, ΔVpgm1 and ΔVpgm2 are selected as described with respect to FIG. 11.

Figure 14:
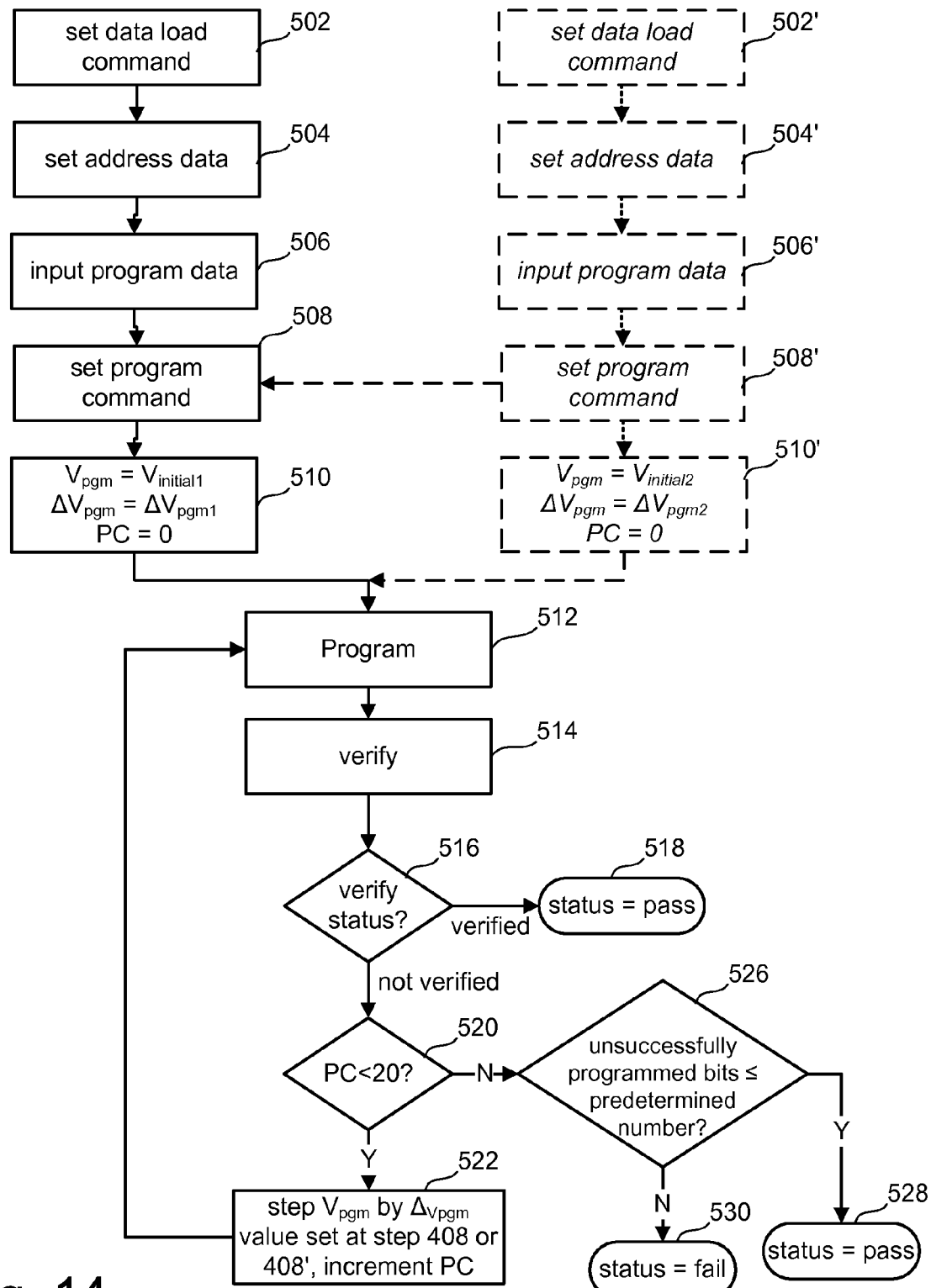
FIG. 14 is a flowchart depicting a method of programming non-volatile memory in accordance with one embodiment.

FIG. 14 is a flowchart of a method for programming non-volatile memory in accordance with one embodiment. A variable increment value is used based on the state being programmed and/or the type of programming operation and data. At step 502, a "data load" command is issued by controller 318 and input to command circuits 314, allowing data to be input to data input/output buffer 312. The input data is recognized as a command and latched by state machine 316 via a command latch signal, not illustrated, input to command circuits 314. At step 504, address data designating the page address is input to row controller or decoder 306 from the controller or host. The input data is recognized as the page address and latched via state machine 316, affected by the address latch signal input to command circuits 314. At step 506, a page of program data for the addressed page is input to data input/output buffer 312 for programming. For example, 532 bytes of data could be input in one embodiment. That data is latched in the appropriate registers for the selected bit lines. In some embodiments, the data is also latched in a second register for the selected bit lines to be used for verify operations. In one embodiment, the data corresponds to a logical page of data stored by a set of cells that stores additional logical pages. The set of cells may be said to store multiple logical pages in the physical page defined by the set of cells. A physical page may comprise all the data storable by a set of cells such as a row at one time. It can also represent the maximum amount of data programmable to the set at one time. At step 508, a "program" command is issued by the controller and input to data input/output buffer 312. The command is latched by state machine 316 via the command latch signal input to command circuits 314.

Triggered by the "program" command, the data latched in step 506 will be programmed into the selected memory cells controlled by state machine 316 using the stepped pulses of FIG. 6 applied to the appropriate word line. At step 510, Vpgm, the programming pulse voltage level applied to the selected word line, is initialized to the starting pulse (e.g., 12V) and a program counter PC maintained by state machine 316 is initialized at 0 or another value. At step 512, the first Vpgm pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to $V_{DD}$ to inhibit programming.

At step 514, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 516, it is checked whether all of the data latches are storing logic "1." If so, the programming process is complete and successful because all selected memory cells were programmed and verified to their target states. A status of "PASS" is reported at step 518.

If, at step 516, it is determined that not all of the data latches are storing logic "1," then the programming process continues. At step 520, the program counter PC is checked against a program limit value. One example of a program limit value is 20, however, other values can be used in various implementations. If the program counter PC is not less than 20, then it is determined at step 526 whether the number of bits that have not been successfully programmed is equal to or less than a predetermined number. If the number of unsuccessfully programmed bits is equal to or less than the predetermined number, then the programming process is flagged as passed and a status of pass is reported at step 528. The bits that are not successfully programmed can be corrected using error correction during the read process. If however, the number of unsuccessfully programmed bits is greater than the predetermined number, the program process is flagged as failed and a status of fail is reported at step 530. If the program counter PC is less than 20, then the Vpgm level is increased by the step size and the program counter PC is incremented at step 522. After step 522, the process loops back to step 512 to apply the next Vpgm pulse.

As indicated at steps 502'-510', the memory system may receive additional data for one or more arrays while performing any of the operations depicted in FIG. 14. An additional data load command 502' may be issued by the controller in response to data from the host at anytime. Step 502' may occur in other locations and times than as specifically shown in FIG. 14. Data from the host may be received, and a data load command executed at step 502' to load address data at the row controller(s) at step 504' and program data into the available registers at the array at step 506'. In one embodiment, the controller waits until the state machine or column controller issues an available signal that it can receive more data in the registers.

At step 508', the controller and state machine can process the newly received data in various ways. In one embodiment, the controller stops the current lower page programming operation. This is represented by the arrow from box 508' to box 508. The controller then issues a new program command instructing the state machine to program the lower page and upper page data at the same time (concurrently) using full sequence programming. The state machine can set ΔVpgm to ΔVpgm2 at step 510' so a larger increment value is used when programming both pages in full sequence. The programming operation then continues as previously described, but using the larger increment value ΔVpgm2. In one embodiment shown at 510', Vpgm is reset before beginning full sequence and the PC counter is reset to 0. Vinitial2 can be equal to, less than, or greater than Vinitial1. Vpgm is not reset in all embodiments, however. For example, if the upper page data arrives relatively quickly and only a few program voltage pulses have been applied, Vpgm may begin at its last peak value, at a value larger than the last peak value (incremented by ΔVpgm2 or another value), or at a value smaller than the last peak value.

Figure 15:
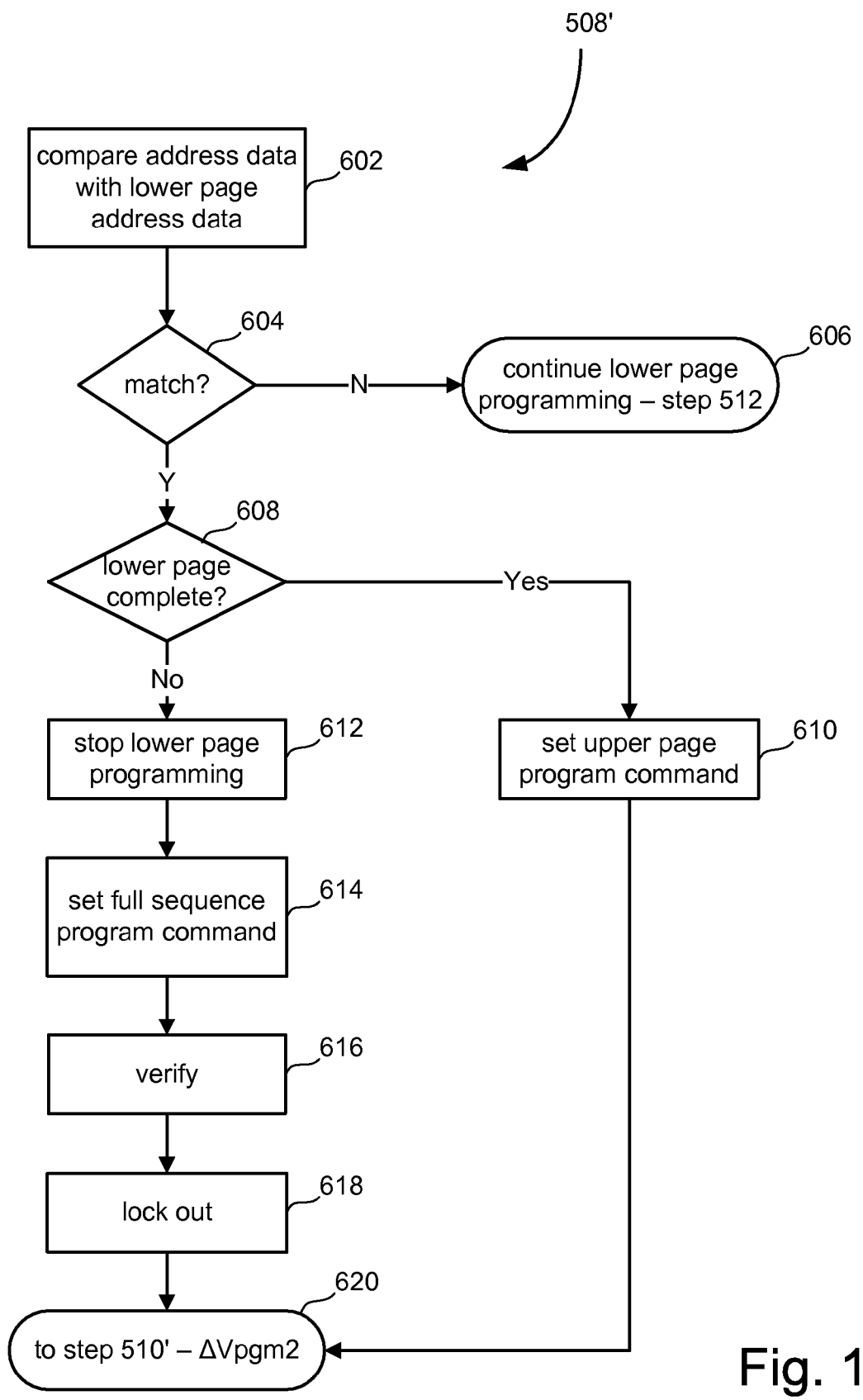
FIG. 15 is a flowchart depicting a method for setting a program command when additional data for a set of memory cells currently being programmed is received.

FIG. 15 is a flowchart depicting more details of setting the program command in step 508' of FIG. 14. FIG. 15 is but one exemplary implementation where a smaller increment value is used for lower page programming and a larger increment value is used for upper page programming or full sequence programming. In the embodiment of FIG. 15, the controller, prior to issuing the program command to the column control circuitry, compares the address data of the newly received data with the data currently being programmed for the lower page of the set of memory cells at step 602. If the controller sees a match at step 604, meaning that the data being programmed is for the same memory cells that the newly received data is for, the method proceeds at step 608. In one embodiment, the state machine and/or column control circuitry perform step 604. If the address data does not match, lower page programming continues, e.g., by applying the next program voltage pulse at step 512 of FIG. 14. The method of FIG. 14 may continue at other locations after step 606 of FIG. 15 besides step 512. If the address data does match, the controller determines if lower page programming is complete at step 608. Lower page programming may be complete when a predetermined number of program voltage pulses have been applied, when all of the cells to be programmed to state A have been successfully programmed to state A, or when a predetermined number of cells have been successfully programmed to state A.

If lower page programming is complete, the upper page data is programmed into the set of memory cells beginning at step 610, where the upper page program command is issued by the controller. At step 620, upper page programming continues as depicted at step 510' in FIG. 14, where the program voltage signal is initialized to Vinitial2 and ΔVpgm is set to ΔVpgm2. A second increment value of ΔVpgm2 is used to increase the size of subsequent programming pulses when programming the upper page of the memory cells. Because the memory cells in state A will have a naturally wider threshold voltage distribution due to subsequently programmed neighbors, a smaller ΔVpgm1 is used when programming the lower page and a larger ΔVpgm2 is used for the upper page at step 512.

If lower page programming is not complete (or not close enough to completion), the controller stops the lower page programming operation at step 612. In FIG. 14, the controller stopping lower page programming is conceptually illustrated by the arrow from step 508' to step 508. The controller or state machine can issue a command forcing the column control circuitry to stop programming the lower page of data. After stopping the lower page programming at step 612, the controller sets the full sequence program data command at step 614. In one embodiment, the command is input to buffer 312 and latched by the state machine via the command latch signal input to the command circuitry. The state machine is triggered to program the selected memory cells in response to the program command. The controller can cause the column control circuitry to perform a verify operation at step 616 to determine which cells have been successfully programmed during the lower page programming. For any cells that have reached their target levels, the controller will lock those cells out from further programming. After locking out the already programmed cells, the method continues at step 620, corresponding to step 510' of FIG. 14, where the increment value can be adjusted.

ΔVpgm2 is larger than ΔVpgm1 in one embodiment. A lower ΔVpgm1 is used for lower page programming or for programming the lowest programmed physical state in order to reduce the width of the state A distributions after programming. Because of the additional capacitive coupling effects experienced by the cells in state A, the lower ΔVpgm value is used to avoid over programming and/or causing program disturb. In one embodiment, step 510' further includes resetting the initial value of Vpgm. For example, if the lower page programming was nearly complete, the value of Vpgm may be reset to a lower value before applying the voltage signal to program the upper page or to program in full sequence. In one embodiment, Vpgm is reset to the same starting value as when beginning the lower page programming. In one embodiment, Vpgm is reset to a value lower than its current value but not as low as the original value for lower page programming. In yet another embodiment when beginning full sequence or upper page programming after completing lower page programming, the program voltage signal is increased or decreased by a third increment value ΔVpgm3 from the last value used when programming the lower page. In one embodiment, the program voltage signal Vpgm is not reset before beginning upper page or full sequence programming. The last voltage pulse for lower page programming is increased by ΔVpgm2 in one embodiment. In another embodiment, the last voltage pulse for lower page programming is increased by ΔVpgm3 for the first upper page or full sequence pulse. After the first additional pulse, the value is increased by ΔVpgm2 as described. ΔVpgm3 can be larger than ΔVpgm2 to provide a more stable transition between the two programming rates that result from the two different step sizes.

Step 510' can also include resetting the program counter PC. For example, a maximum number of pulses can be established independently for lower page and upper page or full sequence programming. When programming transitions between lower page and upper page or between lower page and full sequence programming, the counter PC can be reset to 0 or another value. In another embodiment, the counter PC is not reset and a total maximum number of iterations or pulses for the whole programming operation are used. Other variations may be practiced in accordance with embodiments.

In a variation of the technique described in FIG. 15, the increment value for the program voltage pulses is not increased until programming the lowest programmed state is complete, even after transitioning to full sequence programming. If the controller determines that lower page programming is complete at step 608. The operation proceeds at step 610 as already described. If lower page programming has not completed, however, the controller stops the lower page programming process and coverts to full sequence programming as illustrated at steps 612-618. However, the program voltage increment value will not be changed to ΔVpgm2 until programming for the lowest programmed state (e.g., state A) has completed. When all or a predetermined cells are verified as having reached state A, the program voltage increment value can be changed to ΔVpgm2. In one embodiment, a predetermined number of program voltage pulses is selected and used to determine when to switch to ΔVpgm2. For example, after switching to full sequence programming, the program voltage increment value can be changed to ΔVpgm2 after a predetermined number of program voltage pulses have been applied since originally beginning the lower page programming process.

In one embodiment, a determination that lower page programming is complete at step 608 can be based on a predetermined number of iterations of the lower page programming cycle (i.e., predetermined number of program voltage pulses), regardless of whether the cells are actually programmed to the appropriate state (e.g., state A). Lower page programming can also be determined to be complete when a predetermined number of cells have reached the appropriate state, which could be before the entire set of cells normally required to verify successful lower page programming has reached the appropriate state. In either of these instances, some cells may need additional programming based on the lower page data after resetting the program voltage signal and using an increment value of ΔVpgm2. This can be handled during upper page programming at step 610 by not locking out those cells to be programmed to state A that have not verified as having reached state A, and continuing to verify at the state A level during upper page programming.

In one embodiment that transitions to upper page programming at step 610 when some cells may still need to be programmed to the lowest programmed state, ΔVpgm is not changed to ΔVpgm2 until programming for the lowest programmed state completes. ΔVpgm1 will continue to be used during upper page programming until programming for the lowest programmed state is verified. For example, after a predetermined number of the cells to be programmed to state A have reached state A, ΔVpgm can be changed from ΔVpgm1 to ΔVpgm2.

In yet another variation to FIG. 15, the controller does not stop the lower page programming process and convert to full sequence programming immediately upon receiving the upper page data if the lower page programming is not complete as determined at step 608. Rather, the controller waits until it determines that lower page programming is complete before transitioning.

Figure 16:
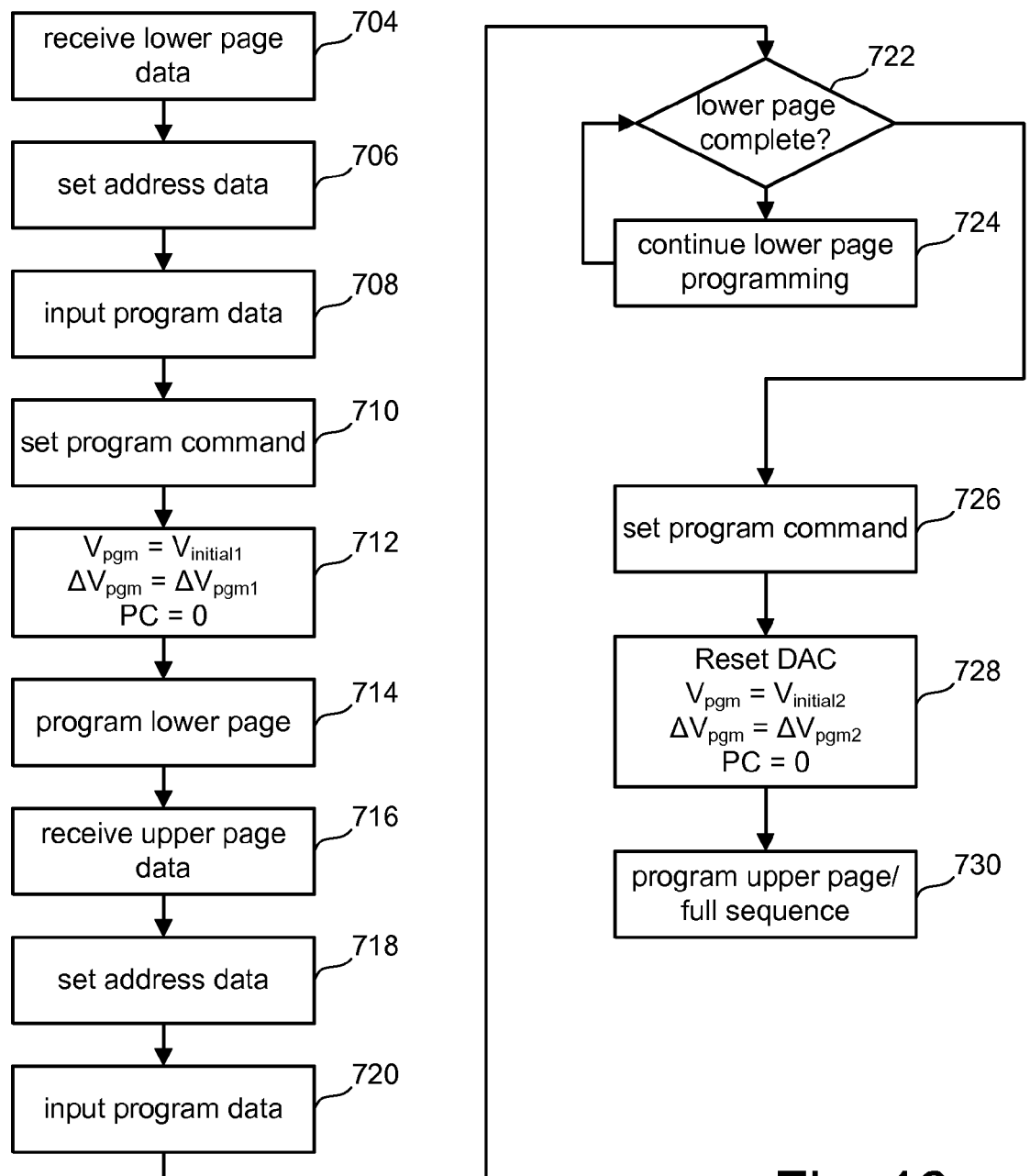
FIG. 16 is a flowchart depicting a method for transitioning to full sequence or upper page programming using larger increment values when lower page programming is complete.

FIG. 16 is a flowchart of a method that only changes the increment value after additional data is received if programming for the lower page is complete. The technique can switch increment values when transitioning from lower page programming to upper page programming or from lower page programming to full sequence programming. Lower page data is received at step 704. The address data is set at step 706, program data is input at step 708, and the controller issues the program command at step 710. Vpgm is set to its initial value, the program counter initialized, and ΔVpgm set to ΔVpgm1 at step 712. The lower page data is programmed at step 714, for example as shown in FIG. 14 (steps 512-530). While programming the lower page, upper page data is received at step 716. The address data is set at step 718 and the program data input at step 720. Before issuing an updated program command, the controller determines if lower page programming is complete at step 722. As previously described for step 608 of FIG. 15, determining if state A programming is complete can be performed in various ways. A determination can be made if all or a predetermined number of the cells to be programmed to state A have reached state A. In other instances, step 722 can include determining if a predetermined number of pulses have been applied and if so, determine that lower page programming is complete.

If lower page programming is not complete, the controller continues lower page programming at step 724 and continues in this loop to wait for lower page programming to complete. When lower page programming completes, the method continues at step 726 where the controller issues an updated program command. The controller can reset Vpgm to an initial value Vinitial2, reset the increment value ΔVpgm to ΔVpgm2, and reset the program counter PC at step 728. After resetting the signals, which can be performed by resetting a digital to analog converter responsible for providing the program voltage signal, programming under the new command begins at step 730.

In one embodiment, the program command set at step 726 is for upper page programming. At step 722, the controller can wait until programming for state A is successfully verified before determining that lower page programming is complete. In such a case, the lower page programming data is already programmed and programming for the upper page is all that needs to be performed at step 730. In a variation of this technique, the upper page program command can be issued at 726 and programming continue for the upper page at step 730 as soon as lower page programming completes. However, ΔVpgm is not reset at step 728 until programming for the lowest programmed state is verified as complete. Those cells already programmed to state A that are to be programmed to state A will be locked out from further programming and those to be programmed to state A that have not reached state A will undergo further programming and verification. When state A programming is verified as complete, the program voltage increment value can be changed to ΔVpgm2.

Where a determination that lower page programming is complete at step 722 is made when some cells may still need to be raised to state A (e.g., by determining based on a predetermined number of pulses), programming can transition to full sequence programming at step 726 in one embodiment. Verification can be performed before applying the first program voltage pulse for full sequence programming. Any cells that reached their final target state during lower page programming can be locked out from additional programming during full sequence programming. Any cells to be programmed to state A that had not reached state A by the time a determination that lower page programming was complete will undergo additional programming during the full sequence iterations. The full sequence programming can perform verification at the state A level so that cells that did not reach their target A state during lower page programming can be programmed to state A during full sequence programming. In one embodiment, the transition to full sequence programming at step 726 is made when lower page programming completes but the program voltage increment value is not changed to ΔVpgm2 until the lowest programmed state is verified as complete (if not already so verified).

Embodiments that only transition to full sequence programming (or upper page programming) and a larger increment value after completing lower page programming as shown in FIG. 16 may provide benefits in particular implementations. For example, some memory devices will use a digital to analog converter to produce a program voltage signal for the different sized program voltage pulses. The digital to analog converter can form part of the row control circuitry in one embodiment. Some converters rely on a digital input value to produce analog program voltage pulses having the requisite peak values. In some cases, altering a program voltage increment value in the middle of a program voltage pulse sequence may prove problematic. Changing the increment size may not produce the next pulse with a peak value equal to the previous pulse plus the new increment value. Rather, some converters will produce the next pulse as if the increment value had been at the new level since beginning programming for that sequence. Accordingly, in one embodiment that uses such a converter, the system will wait for lower page programming to complete. When lower page programming completes, the digital to analog converter can be reset with the new increment value as well and an initial program voltage pulse size. This will avoid any inconsistencies or large jumps in the program voltage pulse values.

Although embodiments have been described in accordance with transitions from lower page programming to full sequence programming or from lower page programming to upper page programming, embodiments can be applied to single type programming operations. For example, in one embodiment a smaller increment value ΔVpgm1 is used when programming the lowest programmed state in full sequence programming. When the lowest programmed state, e.g. state A, completes programming, the ΔVpgm can be reset to a larger increment value ΔVpgm2. In this manner, the increased capacitive coupling effects experienced by the memory cells programmed to state A are compensated for by the lower ΔVpgm1. Although no change in programming methodology was performed, the increment value is still adjusted to more precisely the lowest level programmed state.

In one embodiment, statistics are used to predict when the lowest programmed state will complete programming. The program voltage increment size can be changed after the predicted completion of lower state programming. For example, it may be determined that the lower state completes programming after 8 pulses 90% of the time. The programming algorithm could use a smaller ΔVpgm1 for the first eight program voltage pulses and then switch to a larger increment value ΔVpgm2 for the remaining pulses. In this manner, no circuitry is necessary to assess whether lower page programming is actually complete and alter the program voltage increment value in response. Rather, the increment value is automatically changed after a specified or predetermined number of pulse or applications of the program voltage signal. This approach can be used with any of the aforementioned techniques that wait for the lowest programmed state to complete programming before switching the increment value. For example, the predetermined number of pulses applied before switching to ΔVpgm2 as previously described can be based on statistical estimations of when programming cells to state A will be complete.

Techniques for changing increment values when transitioning from lower page to upper page or full sequence programming, or when programming for the first programmed state is complete, can be combined with other techniques for programming. In one embodiment, so called coarse/fine programming is utilized in conjunction with a changed increment value.

In coarse/fine programming, a coarse programming phase includes an attempt to raise a threshold voltage in a faster manner while paying less attention to achieving a tight threshold voltage distribution. The fine programming phase attempts to raise the threshold voltage in a slower manner in order to reach the target threshold voltage, thus achieving a tighter threshold voltage distribution. One example of a coarse/fine programming methodology can be found in U.S. Pat. No. 6,643,188, incorporated herein by reference in its entirety.

Figure 17C:
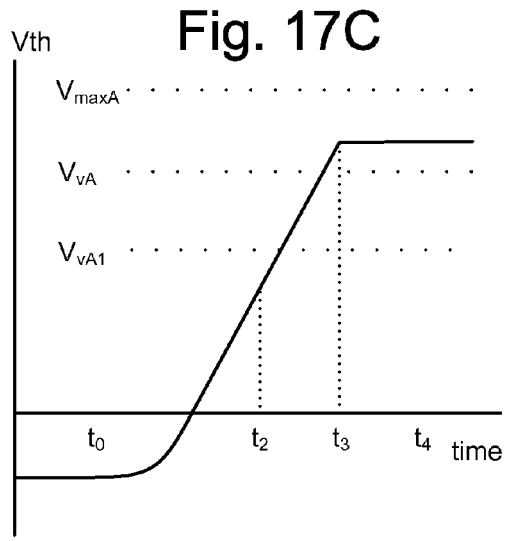
FIGS. 17A, 17B and 17C depict one embodiment of a programming process that is performed as part of coarse/fine programming.
Figure 18C:
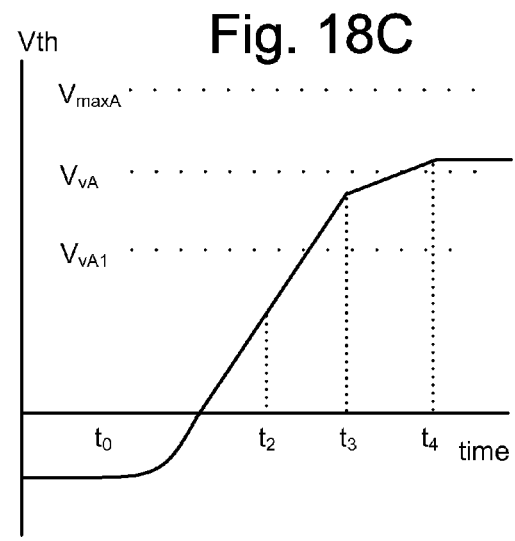
FIGS. 18A, 18B and 18C depict one embodiment of a programming process that is performed as part of coarse/fine programming.
Figure 17B:
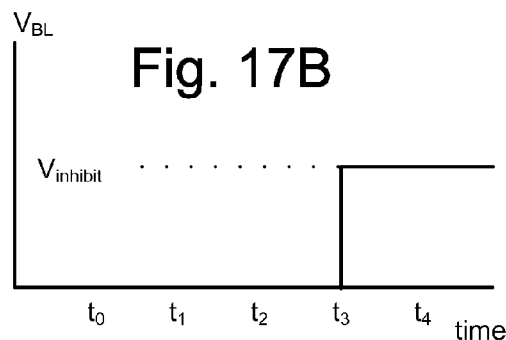
Figure 18B:
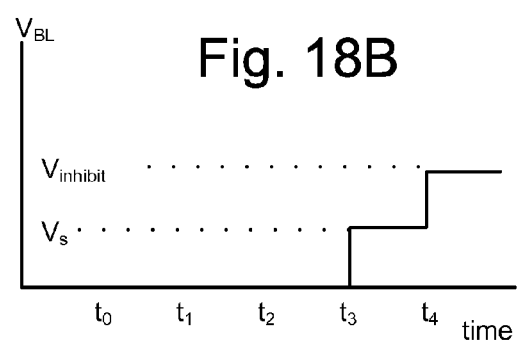
Figure 17A:
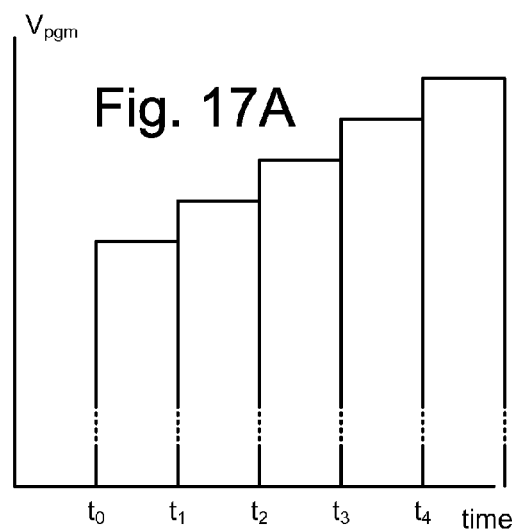
Figure 18A:
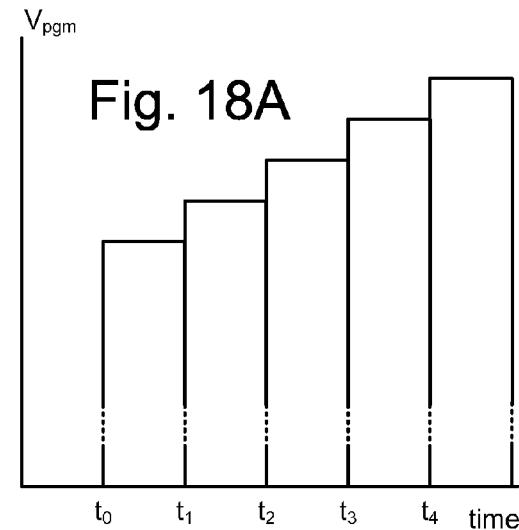

FIGS. 17 and 18 provide more detail of one example of a coarse/fine programming methodology. FIGS. 17A and 18A depict the programming pulses $V_{pgm}$ applied to the control gate. FIGS. 17B and 18B depict the bit line voltages for the memory cells being programmed. FIGS. 17C and 18C depict the threshold voltage of the memory cells being programmed. This example depicts programming of memory cells to state A using two verify levels, indicated in the Figures as $V_{vA1}$ and $V_{vA}$. The final target level is $V_{vA}$. When a threshold voltage of the memory cell has reached $V_{vA}$, the memory cell will be inhibited from further programming by applying an inhibit voltage to the bit line corresponding to that memory cell. For example, the bit line voltage can be raised to $V_{inhibit}$ (See FIG. 17B and FIG. 17B). However, when a memory cell has reached a threshold voltage close to (but lower than) the target value $V_{vA}$, the threshold voltage shift of the memory cell during subsequent programming pulses is slowed down by applying a certain bias voltage to the bit line, typically on the order of 0.3v to 0.8v. Because the rate of threshold voltage shift is reduced during the next few programming pulses, the final threshold voltage distribution can be narrower. To implement this method, a second verify level that is lower than that of $V_{vA}$ is used. This second verify level is depicted in FIGS. 17 and 18 as $V_{vA1}$. When the threshold voltage of the memory cell is larger than $V_{vA1}$, but still lower than $V_{vA}$, the threshold voltage shift to the memory cell will be reduced for subsequent programming pulses by applying a bit line bias $V_s$ (FIG. 18B). Note that in this case, two verify operations are required for each state. One verify operation at the corresponding final verify level (e.g., $V_{vA}$) for each state to which the coarse/fine programming methodology is applied, and one verify operation at the corresponding second verify level (e.g., $V_{vA1}$) for each state. This may increase the total time needed to program the memory cells. However, a larger $\Delta V_{pgm}$ step size can be used to speed up the process.

FIGS. 17A, 17B, and 17C show the behavior of a memory cell whose threshold voltage moves past $V_{vA1}$ and $V_{vA}$ in one programming pulse. For example, the threshold voltage is depicted in FIG. 17C to pass $V_{vA1}$ and $V_{vA}$ in between $t_2$ and $t_3$. Thus, prior to $t_3$, the memory cell is in the coarse phase. After t3, the memory cell is in the inhibit mode.

FIGS. 18A, 18B, and 18C depict a memory cell that enters both the coarse and fine programming phases. The threshold voltage of the memory cell crosses $V_{vA1}$ in between time $t_2$ and time $t_3$. Prior to $t_3$, the memory cell is in the coarse phase. After $t_3$, the bit line voltage is raised to Vs to place the memory cell in the fine phase. In between $t_3$ and $t_4$, the threshold voltage of the memory cell crosses $V_{vA}$. Therefore, the memory cell is inhibited from further programming by raising the bit line voltage to $V_{inhibit}$.

In one embodiment, these coarse/fine programming techniques are used when changing increment values. The use of coarse/fine programming can produce a narrower threshold distribution. This can be used to compensate for any increase in the width of a distribution that results from using a larger increment value. These techniques can be incorporated into the change in increment values in various fashions.

For example, coarse/fine programming can be used when programming and verifying each state in one embodiment. In one embodiment where the increment value is changed however, coarse/fine programming can be used in conjunction with the switch in increment values. For example, a single final verify level can be used when programming the lower page for determining if the cells have reached state A for example. When programming in full sequence or for the upper page after increasing the increment value, coarse/fine programming can be instigated. In one embodiment, coarse and fine verify levels are used for each state during the full sequence or upper page programming. In other embodiments, coarse and fine verify levels are only used for a select state or states. For example, coarse and fine levels could be used just for state B and state C or just state C.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A non-volatile memory system, comprising:
   a set of multi-state non-volatile storage elements;
   managing circuitry in communication with said set of non-volatile storage elements, said managing circuitry includes a digital to analog converter for providing a program voltage signal to said set of non-volatile storage elements, said managing circuitry programs said set of non-volatile storage elements by:
      receiving a request to program data to said set of multi-state non-volatile storage elements,
      applying by said program voltage signal a predetermined number of program voltage pulses to said set to program said data to said non-volatile storage elements, said applying includes increasing a size of each of said program voltage pulses by a first increment value until said predetermined number is reached,
      resetting said program voltage signal, and
      after resetting said program voltage signal, applying by said program voltage signal one or more additional program voltage pulses to said set to complete programming of said data, said applying one or more additional program voltage pulses includes increasing a size of each of said one or more additional program voltages by a second increment value.

2. The non-volatile memory system of claim 1, wherein:
   said applying a predetermined number of program voltage pulses includes raising a threshold voltage of non-volatile storage elements to be programmed to a first programmed state, a second programmed state, and a third programmed state; and
   said applying one or more additional program voltage pulses includes raising a threshold voltage of non-volatile storage elements to be programmed to said second programmed state and said third programmed state.

3. The non-volatile memory system of claim 2, wherein:
   said applying one or more additional program voltage pulses includes raising a threshold voltage of non-volatile storage elements to be programmed to said first programmed state.

4. The non-volatile memory system of claim 3, wherein:
   said applying a predetermined number of program voltage pulses includes programming said set of non-volatile storage elements using full sequence programming; and
   said applying one or more additional program voltage pulses includes programming said set of non-volatile storage elements using full sequence programming.

5. The non-volatile memory system of claim 4, wherein:
   said applying a predetermined number of program voltage pulses using full sequence programming includes simultaneously programming said set to a first programmed state, a second programmed state, and a third programmed state.

6. The non-volatile memory system of claim 1, wherein said second increment value is larger than said first increment value.

7. The non-volatile memory system of claim 1, wherein:
   said managing circuitry resets said program voltage signal by lowering a peak value of said program voltage signal to an initial value before applying said one or more additional program voltage pulses.

8. The non-volatile memory system of claim 1, wherein:
   applying said one or more additional program voltage pulses includes applying a first of said additional program voltage pulses;
   applying said predetermined number of program voltage pulses includes applying a last of said predetermined number of program voltage pulses; and
   said first additional program voltage pulse has a peak value substantially equal to a sum of a peak value of said last program voltage pulse and said second increment value.

9. The non-volatile memory system of claim 1, wherein:
   applying said one or more additional program voltage pulses includes applying a first of said additional program voltage pulses;
   applying said predetermined number of program voltage pulses includes applying a last of said predetermined number of program voltage pulses; and
   said first additional program voltage pulse has a peak value substantially equal to a sum of a peak value of said last program voltage pulse and a third increment value.

10. The non-volatile memory system of claim 9, wherein:
    said third increment value is larger than said second increment value.

11. The non-volatile memory system of claim 9, wherein:
    said set of multi-state non-volatile storage elements is a set of multi-state NAND type flash memory devices.

12. The non-volatile memory system of claim 1, wherein:
    said set of multi-state non-volatile storage elements is part of an array of non-volatile storage elements removable from a host system.

13. The non-volatile memory system of claim 1, wherein:
    said set of multi-state non-volatile storage elements is part of an array of non-volatile storage elements embedded in a host system.

14. A non-volatile memory system, comprising:
    a set of multi-state non-volatile storage elements adapted to maintain data in at least an erased state, a first programmed state, a second programmed state, and a third programmed state; and
    managing circuitry in communication with said set of multi-state non-volatile storage elements, said managing circuitry programs said memory system by:
       receiving a request to program data to said set of multi-state non-volatile storage elements,
       applying one or more program voltage pulses to said set to program said data to said non-volatile storage elements, said applying includes increasing a size of each of said program voltage pulses by a first increment value until programming of storage elements to said first programmed state is complete, said first programmed state includes lower threshold voltages than said second programmed state and said third programmed state, and after programming of storage elements to said first programmed state is complete, applying one or more additional program voltage pulses to said set of non-volatile storage elements to complete programming of said data to said non-volatile storage elements, said applying one or more additional program voltage pulses includes increasing a size of each of said one or more additional program voltage pulses by a second increment value while programming storage elements to said second programmed state and said third programmed state, said second increment value is larger than said first increment value.

15. The non-volatile memory system of claim 14, wherein:
said applying one or more program voltage pulses programs a first page of data to said set of non-volatile storage elements, said applying includes increasing a size of each of said program voltage pulses by said first increment value until programming said first page of data is complete; and
said applying one or more additional program voltage pulses programs a second page of data to said non-volatile storage elements, said applying includes increasing a size of each of said program voltage pulses by said second increment value until programming said second page of data is complete.

16. The non-volatile memory system of claim 15, wherein said managing circuitry receives said second page of data before completing programming said first page of data, said managing circuitry continues to apply said one or more program voltage pulses until programming said first page of data is complete, said managing circuitry begins applying said one or more additional program voltage pulses begins after programming said first page of data is complete.

17. The non-volatile memory system of claim 14, wherein:
said applying one or more program voltage pulses includes programming said set of non-volatile storage elements using full sequence programming; and
said applying one or more additional program voltage pulses includes programming said set of non-volatile storage elements using full sequence programming.

18. The non-volatile memory system of claim 14, wherein:
said set of non-volatile storage elements is associated with a plurality of NAND strings of multi-state flash memory devices.

19. A non-volatile memory system, comprising:
a plurality of non-volatile storage elements;
a plurality of data buffers in communication with said non-volatile storage elements; and
managing circuitry in communication with said buffers and non-volatile storage elements, wherein said managing circuitry receives first data to be stored in said non-volatile storage elements and in response, provides said first data to a first set of said buffers, said managing circuitry programs said first data to said storage elements using one or more program voltage pulses increased by a first increment value, said managing circuitry receives second data to be stored in said storage elements while programming said first data and in response, provides said second data to a second set of said buffers, said managing circuitry stops programming said first data to said non-volatile storage elements after receiving said second data and begins concurrently programming said first data and said second data to said non-volatile storage elements using one or more program voltage pulses increased by a second increment value.

20. The non-volatile memory system of claim 19, wherein:
said managing circuitry verifies said non-volatile storage elements for said first data prior to beginning said concurrently programming, said managing circuitry inhibits ones of said storage elements verified for said first data from being programmed during said concurrently programming.

21. The non-volatile memory system of claim 20, wherein:
said managing circuitry verifies whether ones of said non-volatile storage elements to be programmed to a first programmed state have reached said first programmed state, said managing circuitry inhibits ones of said non-volatile storage elements to be programmed to said first programmed state that have reached said first programmed state from being programmed during said concurrently programming.

22. The non-volatile memory system of claim 19, wherein:
said second increment value is larger than said first increment value.

23. The non-volatile memory system of claim 19, wherein:
said managing circuitry continues programming said first data to said storage elements before beginning said concurrently programming and after providing said second data, said managing circuitry determines when a first programmed state of said storage elements has completed programming and after determining that said first programmed state is complete, begins said concurrently programming.

24. The non-volatile memory system of claim 23, wherein:
said managing circuitry includes a digital to analog converter that provides a program voltage signal including said one or more program voltage pulses and said one or more additional program voltage pulses, said managing circuitry resets said digital to analog converter after determining that said first programmed state is complete, said resetting includes resetting an increment value for said program voltage signal from said first increment value to said second increment value and resetting an initial program voltage pulse value provided by said program voltage signal.

25. The non-volatile memory system of claim 23, wherein:
said managing circuitry determines that said first programmed state of said non-volatile storage elements has completed programming when a predetermined number of program voltage pulses have been applied to said storage elements, irrespective of an actual physical state of said non-volatile storage elements.

26. The non-volatile memory system of claim 23, wherein:
said managing circuitry determines that said first programmed state has completed programming when a predetermined number of said non-volatile storage elements has reached said first programmed state.

27. The non-volatile memory system of claim 23, wherein:
said storage elements maintain data in four physical states;
said managing circuitry programs said first data by programming storage elements to said first programmed state; and
said managing circuitry concurrently programs said first data and said second data by programming storage elements to said first programmed state, a second programmed state and a third programmed state.

28. The non-volatile memory system of claim 27, wherein:
said managing circuitry programs storage elements to said first programmed state using a first verify level; and said managing circuitry programs storage elements to said second programmed state using a second verify level and a third verify level.

29. The non-volatile memory system of claim 28, wherein: said managing circuitry programs storage elements to said third programmed state using a fourth verify level and a fifth verify level.

30. The non-volatile memory system of claim 28, wherein: said managing circuitry slows down programming of storage elements to be programmed to said second programmed state after determining that said storage elements have reached said second verify level but not said third verify level.

31. The non-volatile memory system of claim 30, wherein: said managing circuitry slows down programming of said storage elements by raising a voltage applied to a bit line coupled to each of said storage elements.

32. The non-volatile memory system of claim 19, wherein: said one or more program voltage pulses used during programming said first data include a last program voltage pulse before stopping programming said first data; and said one or more program voltage pulses used during said concurrently programming include a first program voltage pulse after stopping programming said first data, said first program voltage pulse is smaller than said last voltage pulse.

33. The non-volatile memory system of claim 19, wherein: said one or more program voltage pulses used during programming said first data include a last program voltage pulse before stopping programming said first data; and said one or more program voltage pulses used during said concurrently programming include a first program voltage pulse after stopping programming said first data, said first program voltage pulse has a peak value equal to said last voltage pulse incremented by a third increment value.

34. The non-volatile memory system of claim 19, wherein: said plurality of non-volatile storage elements is a plurality of binary flash memory devices.

35. The non-volatile memory system of claim 19, wherein: said plurality of non-volatile storage elements is a plurality of multi-state flash memory devices.

36. The non-volatile memory system of claim 19, wherein: said plurality of non-volatile storage elements are arranged in a NAND architecture with each non-volatile storage element associated with a different NAND string.

37. The non-volatile memory system of claim 19, wherein: said non-volatile storage elements are part of an array of non-volatile storage elements; and said array is embedded in a host system.

38. The non-volatile memory system of claim 19, wherein: said non-volatile storage elements are part of an array of non-volatile storage elements; and said array is removable from a host system.

39. A non-volatile memory system, comprising:
a plurality of non-volatile storage elements, configured to store a physical page of data; and
managing circuitry in communication with said plurality of non-volatile storage elements, said managing circuitry receives first data designated for said non-volatile storage elements, said first data is less than a total amount of data storable in said physical page, said managing circuitry programs said first data to said plurality of non-volatile storage elements by applying one or more program voltage pulses, said managing circuitry increases a size of each program voltage pulse by a first increment value when applying a subsequent program voltage pulse, said managing circuitry receives second data designated for said non-volatile storage elements and determines if programming said first data to said plurality of storage elements is complete, wherein if said managing circuitry determines that programming said first data to said plurality of storage elements is complete said managing circuitry programs said second data to said plurality of non-volatile storage elements by applying one or more additional program voltage pulses, said managing circuitry increases a size of each of said one or more additional program voltage pulses by a second increment value when applying a subsequent additional program voltage pulse, wherein if said managing circuitry determines that said first data has not been successfully programmed to said plurality of storage elements said managing circuitry stops programming of said first data and concurrently programs said first data and said second data to said plurality of non-volatile storage elements by applying one or more additional program voltage pulses after stopping programming of said first data, said managing circuitry concurrently programs said first data and said second data by increasing a size of said one or more additional program voltage pulses by said second increment value when applying a subsequent additional program voltage pulse.

40. The non-volatile memory system of claim 39, wherein: said managing circuitry applies a last of said one or more program voltage pulses when programming said first data before stopping programming said first data, said last program voltage pulse having a first peak value; and said managing circuitry applies a first of said one or more additional program voltage pulses when beginning said concurrently programming said first data and said second data, said first additional program voltage pulse having a lower peak value than said first peak value.

* * * * *